(12) United States Patent
Kalnitsky et al.

(10) Patent No.: US 10,431,737 B2
(45) Date of Patent: Oct. 1, 2019

(54) CO-FIRED PASSIVE INTEGRATED CIRCUIT DEVICES

(71) Applicants: Taiwan Semiconductor Manufacturing Company, Ltd., Hsin-Chu (TW); Apple, Inc., Cupertino, CA (US)

(72) Inventors: Alexander Kalnitsky, San Francisco, CA (US); Shawn Searles, Cupertino, CA (US); David Cappabianca, Cupertino, CA (US)

(73) Assignees: TAIWAN SEMICONDUCTOR MANUFACTURING COMPANY, LTD., Hsinchu (TW); APPLE, Cupertino, CA (US)

( * ) Notice: Subject to any disclaimer, the term of this patent is extended or adjusted under 35 U.S.C. 154(b) by 0 days.

(21) Appl. No.: 16/112,006

(22) Filed: Aug. 24, 2018

(65) Prior Publication Data

US 2019/0013464 A1    Jan. 10, 2019

Related U.S. Application Data

(62) Division of application No. 14/827,147, filed on Aug. 14, 2015, now Pat. No. 10,062,838.

(Continued)

(51) Int. Cl.
*H01L 27/01* (2006.01)
*H01L 43/12* (2006.01)
(Continued)

(52) U.S. Cl.
CPC ............ *H01L 43/12* (2013.01); *H01L 27/013* (2013.01); *H01L 28/10* (2013.01); *H01L 28/40* (2013.01);
(Continued)

(58) Field of Classification Search
CPC ......... H01L 43/12; H01L 28/40; H01L 28/10; H01L 27/013; H05K 1/165; H05K 1/162; H05K 1/0306; H05K 3/007
See application file for complete search history.

(56) References Cited

U.S. PATENT DOCUMENTS 5,400,950 A   3/1995 Myers et al.
5,480,503 A   1/1996 Casey et al.
(Continued)

*Primary Examiner* — Nathan Milakovich
(74) *Attorney, Agent, or Firm* — Haynes and Boone, LLP

(57) ABSTRACT

Co-fired integrated circuit devices and methods for fabricating and integrating such on a workpiece are disclosed herein. An exemplary method includes forming a first passive device and a second passive device over a carrier substrate. The first passive device and the second passive device each include at least one material layer that includes a co-fired ceramic material. The carrier substrate is removed after performing a co-firing process to cause chemical changes in the co-fired ceramic material. The first passive device may include a conductive loop disposed between a first magnetic layer and a second magnetic layer. The first magnetic layer, the second magnetic layer, or both includes a co-fired ceramic magnetic material. The second passive device may include a first conductive layer and a second conductive layer separated by a dielectric layer. The first conductive layer, the second conductive layer, or both includes a co-fired ceramic conductive material.

20 Claims, 26 Drawing Sheets

Related U.S. Application Data

(60) Provisional application No. 62/140,555, filed on Mar. 31, 2015.

(51) Int. Cl.
*H05K 1/16* (2006.01)
*H05K 3/46* (2006.01)
*H05K 1/03* (2006.01)
*H05K 3/00* (2006.01)
*H01L 49/02* (2006.01)

(52) U.S. Cl.
CPC ........... *H05K 1/0306* (2013.01); *H05K 1/162* (2013.01); *H05K 1/165* (2013.01); *H05K 3/007* (2013.01); *H01L 28/60* (2013.01); *H05K 3/4664* (2013.01); *H05K 2201/086* (2013.01); *H05K 2203/1131* (2013.01)

(56) References Cited

U.S. PATENT DOCUMENTS

| | | | |
|---|---|---|---|
| 5,661,647 A * | 8/1997 | Washburn | H02M 3/00 363/147 |
| 6,027,958 A | 2/2000 | Vu et al. | |
| 6,036,809 A | 3/2000 | Kelly et al. | |
| 6,069,397 A | 3/2000 | Cornett et al. | |
| 6,153,290 A * | 11/2000 | Sunahara | H01L 21/4857 156/89.16 |
| 6,411,178 B1 * | 6/2002 | Matsumura | H03H 7/0115 333/134 |
| 6,818,469 B2 | 11/2004 | Mori et al. | |
| 6,875,526 B2 * | 4/2005 | Umemoto | H01F 41/16 174/258 |
| 7,750,247 B2 | 7/2010 | Chikagawa et al. | |
| 7,795,743 B2 | 9/2010 | Kim et al. | |
| 7,841,075 B2 | 11/2010 | Borland et al. | |
| 8,217,279 B2 | 7/2012 | Matsubara et al. | |
| 2001/0023779 A1 | 9/2001 | Sugaya et al. | |
| 2004/0139589 A1 * | 7/2004 | Bothe | H01L 27/08 29/25.41 |
| 2004/0262645 A1 * | 12/2004 | Huff | B81B 7/0064 257/232 |
| 2007/0060970 A1 * | 3/2007 | Burdon | A61N 1/3754 607/37 |
| 2008/0003699 A1 | 1/2008 | Gardner et al. | |
| 2008/0052904 A1 | 3/2008 | Schneider et al. | |
| 2009/0051004 A1 | 2/2009 | Roth et al. | |
| 2012/0228014 A1 | 9/2012 | Das et al. | |
| 2015/0108635 A1 | 4/2015 | Liang et al. | |
| 2015/0366077 A1 | 12/2015 | Kawai et al. | |

* cited by examiner

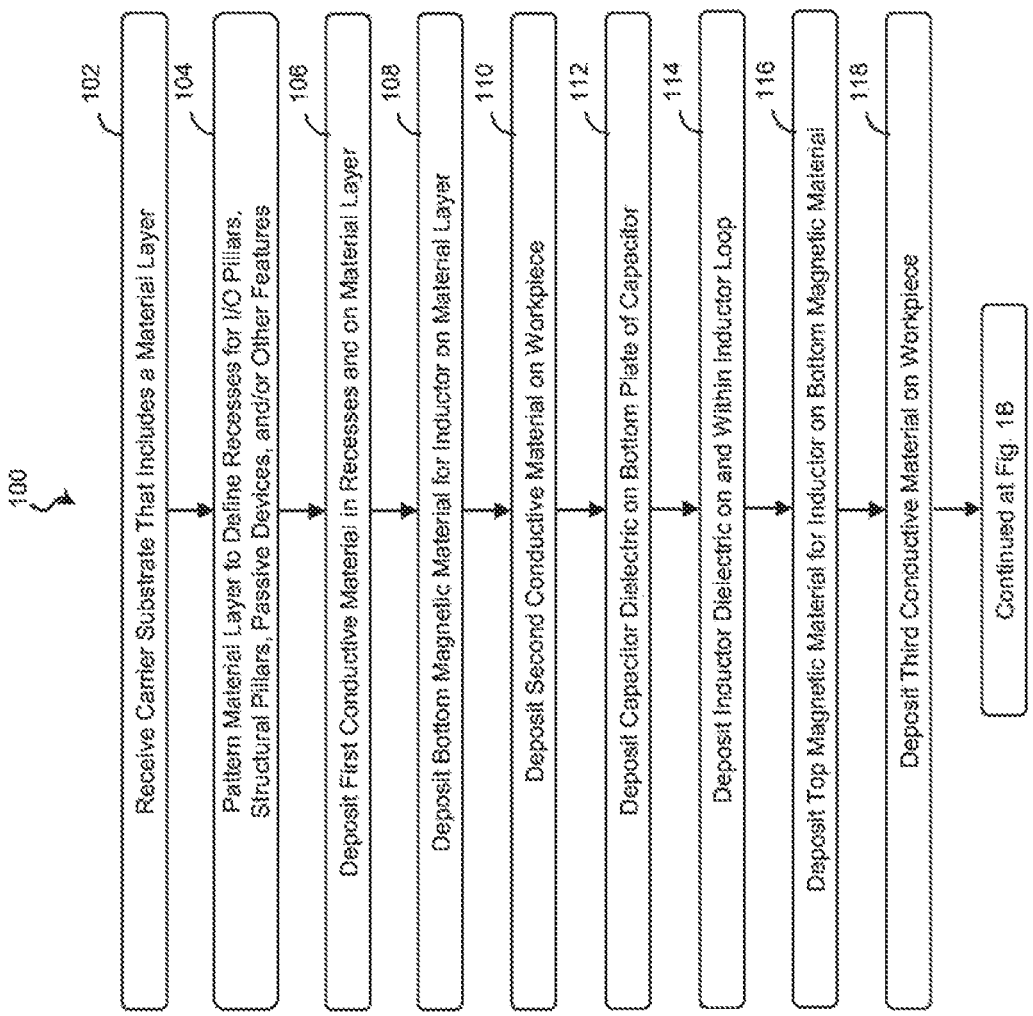

CO-FIRED PASSIVE INTEGRATED CIRCUIT DEVICES

This application is a divisional of U.S. patent application Ser. No. 14/827,147, filed Aug. 14, 2015, which is a non-provisional application of and claims the benefit of U.S. Provisional Patent Application Ser. No. 62/140,555, filed Mar. 31, 2015, the entire disclosures of which are hereby incorporated herein by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, while transistors have scaled down considerably between generations, passive devices (e.g., resistors, capacitors, inductors, etc.) have not always progressed as quickly. In many cases, the simple physics of these devices pose a substantial roadblock. For example, even with improved materials, shrinking a capacitor or inductor often reduces capacitance or inductance far more than the improved materials can compensate.

In addition to device size, for passive devices that are not formed on the same substrate as the active circuit devices, the manner in which the passive devices are connected may have a significant impact on the size of the finished circuit. In a common example, passive devices and active devices are mounted on a printed circuit board (PCB). Conductive traces on the PCB electrically coupled the various devices. However, PCB traces may be bulky, and the density of devices on the PCB may be low in order to leave room to solder.

To prevent passive devices from having an outsized effect on a circuit footprint, further developments in passive device layout and fabrication are needed. In particular, improvements to device formation and bonding that reduce device and routing area while increasing reliability would be extremely beneficial. Accordingly, while existing passive circuit devices have been generally adequate, the potential for future improvements still exists.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A and 1B are flow diagrams of a method of forming circuit devices according to various aspects of the present disclosure.

DETAILED DESCRIPTION

Figure 1B:
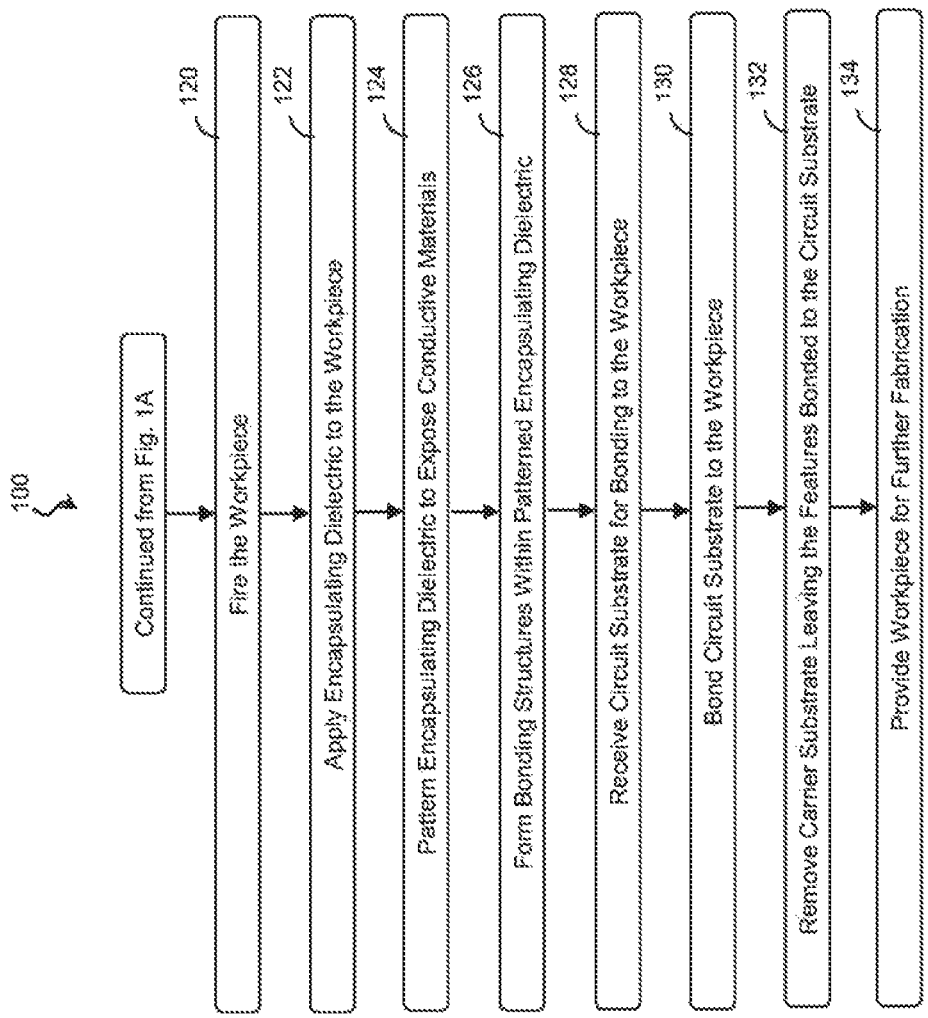

The present disclosure relates generally to integrated circuit (IC) devices and their manufacture and, more particularly, to passive IC devices including inductors and capacitors and to techniques for fabricating such devices.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure relates to the formation of passive devices, including inductors and capacitors. The passive devices may be incorporated into a power supply, a voltage converter, an analog device such as an amplifier, or any other suitable circuit or circuit element. It has been determined that in many applications, wiring a chip to discretely packaged passive devices using a printed circuit board (PCB) or other technique results in a relatively large product. The bulk of the discrete packages and the associated wiring wastes space. This is of particular concern for mobile and cellular applications where space is at a premium.

For example, a typical DC/DC voltage converter, such as a buck converter, may include robust inductors and capacitors able to withstand the voltage swings that occur during the switching phase. Wiring a discretely packaged inductor and capacitor to the voltage converter may entail not-inconsequential PCB space. Furthermore, each bond or solder-point has the potential for failure, adversely affecting yield and longevity. Compounding the problem, in many low-power applications, it is desirable to provide several DC voltage levels so that portions of the circuit can be run at lower voltages. In many architectures, each voltage converter tasked with supplying a particular DC voltage level includes its own inductors and capacitors. Thus, the number of passive devices may be considerable. To address these concerns and others, the technique of the present disclosure provides a cost-effective and reliable technique for forming and bonding multiple passive devices to a circuit substrate and produces a compact package with both active and passive circuit devices. Of course, these advantages are merely exemplary, and no particular advantage is characteristic of or required for any particular embodiment.

In some embodiments, the technique includes forming the passive devices by layering ceramic materials in a paste and/or semiliquid form on a carrier substrate. The ceramic materials may be fired in a low-temperature or high-temperature co-firing process and subsequently bonded to a second substrate containing one or more circuit devices. After bonding, the carrier substrate may be removed, leaving the passive devices and other structures bonded to the circuit device substrate. The technique allows a large number of passive devices to be bonded to a circuit device substrate quickly and with precision, in a manner that may save space and reduce trace length.

An example of a workpiece 200 undergoing a technique for forming one or more circuit devices is described with reference to FIGS. 1-16. In that regard, FIGS. 1A and 1B are flow diagrams of a method 100 of forming circuit devices according to various aspects of the present disclosure. It is understood that additional steps can be provided before, during, and after the steps of method 100, and some of the steps described can be replaced or eliminated for other embodiments of the method. FIGS. 2-8 and 10 are perspective views of a portion of a workpiece 200 undergoing the method 100 according to various aspects of the present disclosure. FIGS. 9A, 9B, and 11-16 are cross-sectional views of various portions of the workpiece 200 undergoing the method 100 according to various aspects of the present disclosure. For clarity and ease of explanation, some elements of the figures have been simplified.

Figure 2:
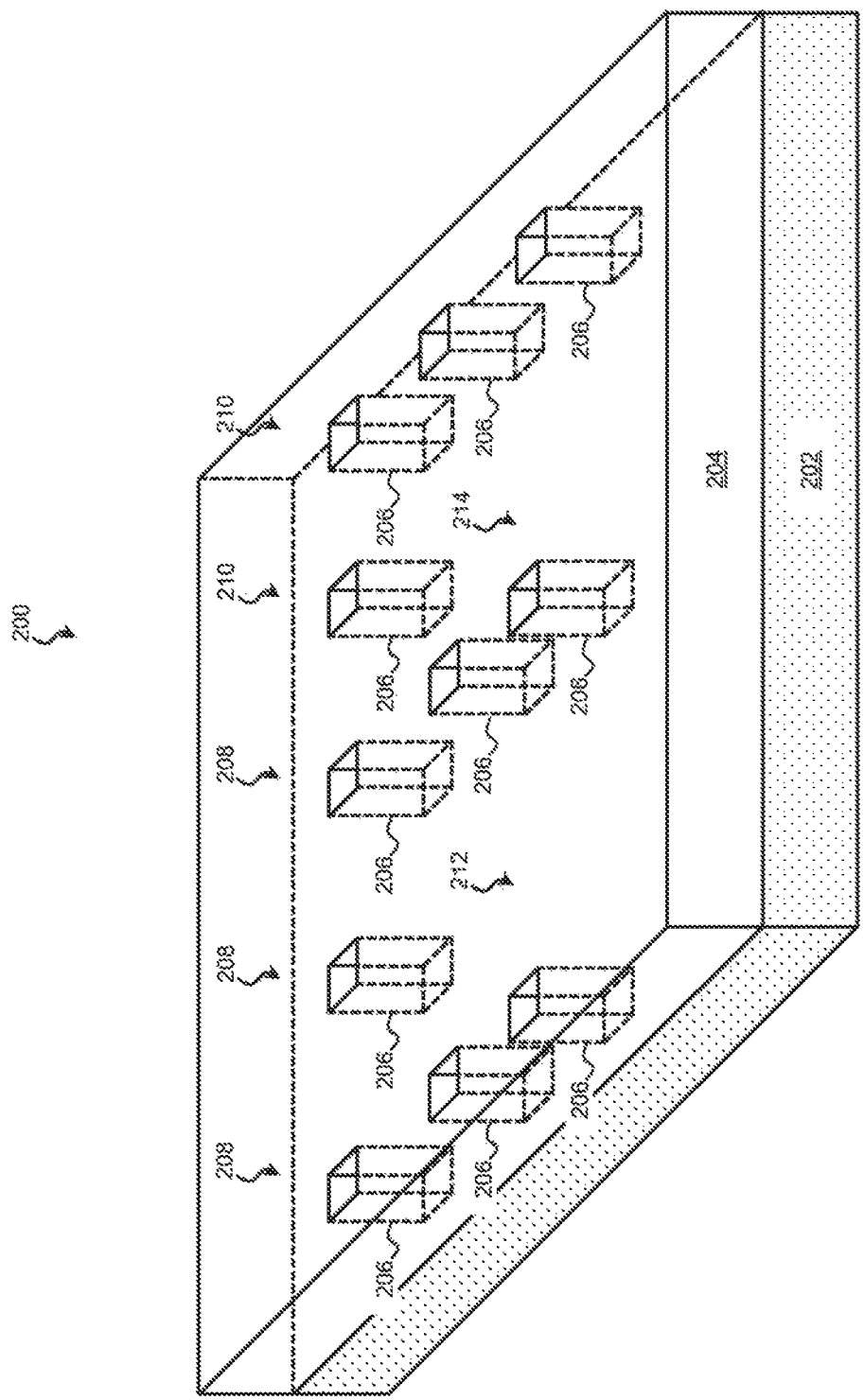
FIGS. 2-8 are perspective views of a portion of a workpiece undergoing the method according to various aspects of the present disclosure.

The method begins in block 102 of FIG. 1A, in which a carrier substrate 202 is received as illustrated in FIG. 2. The carrier substrate 202 represents any material upon which other materials may be formed. One advantage of the present technique is that it allows for wide range of carrier substrate 202 materials and types. For example, in some embodiments, the carrier substrate 202 includes quartz, soda-lime glass, fused silica, fused quartz, and/or calcium fluoride ($CaF_2$). In some embodiments, the carrier substrate 202 includes a metal or a metal alloy, with a suitable example including stainless steel. Additionally or in the alternative, the carrier substrate 202 may include an elementary (single element) semiconductor, such as silicon or germanium in a crystalline structure; a compound semiconductor, such as silicon germanium, silicon carbide, gallium arsenic, gallium phosphide, indium phosphide, indium arsenide, and/or indium antimonide; and/or combinations thereof. The particular composition of the carrier substrate 202 may be selected based on how well deposited materials adhere to the carrier substrate 202, based on firing temperatures associated with any of the deposited materials, based on the ease with which the carrier substrate 202 can be removed from the deposited materials, and/or any other suitable factors.

In the example of FIG. 2, the carrier substrate 202 includes one or more dielectric layers 204. The dielectric layers 204 may include any suitable dielectric material such as a semiconductor oxide, a semiconductor nitride, a semiconductor oxynitride, a semiconductor carbide, and/or other suitable dielectric material. In some exemplary embodiments, the dielectric layer 204 includes silicon oxide and/or silicon nitride. One of skill in the art will recognize that the carrier substrate 202 may include any number of dielectric layers 204, hard mask layers, and/or other material layers disposed within and upon the substrate 202.

Referring to block 104 of FIG. 1A and referring still to FIG. 2, the dielectric layer 204 is patterned to define recesses 206. The recesses 206 may extend partially or completely through the dielectric layer 204 and may expose the carrier substrate 202 underneath. Some recesses may correspond to chip-level I/O via pillars 208 used to electrically couple circuits on other substrates to a package, board, or other circuit. Some recesses may correspond to dummy or structural pillars 210 used for physically coupling circuits without necessarily electrically coupling their circuit elements. Some recesses correspond to contacts for passive devices to be formed on the carrier substrate 202 such as inductors 212 and capacitors 214. The I/O via pillars 208, structural pillars 210, inductors 212, and capacitors 214 take shape as the method 100 progresses. Although a limited number of I/O via pillars 208, structural pillars 210, inductors 212, and capacitors 214 are shown for clarity, it is understood that any number of any feature may be formed on the workpiece 200.

Recesses 206 may be formed in the dielectric layer 204 by any suitable technique including photolithography and/or direct-write lithography. An exemplary photolithographic patterning process includes applying a resist to the workpiece 200. The resist may include a photosensitive material that causes the material to undergo a property change when exposed to radiation. This property change can be used to selectively remove exposed (in the case of a positive tone resist) or unexposed (in the case of a negative tone resist) portions of the resist. To expose the resist using a mask-based lithographic technique, radiation such as ultraviolet light passes through or reflects off the mask before striking the resist, thereby transferring a pattern from the mask to the resist. Following exposure, a post-exposure bake may be performed, and the resist may be developed to selectively remove the exposed or unexposed resist portions. The patterned resist, whether photoresist or direct-write resist, may then be used in conjunction with any suitable etching process such as wet etching, dry etching, reactive ion etching, ashing, and/or other suitable etching technique in order to pattern the dielectric layer 204. Other suitable patterning processes include direct-write lithography, which may use a laser, an ion beam, an electron beam (e-beam), or other narrow-focused emission to expose a resist coating or to pattern the dielectric layer 204 directly.

Figure 3:
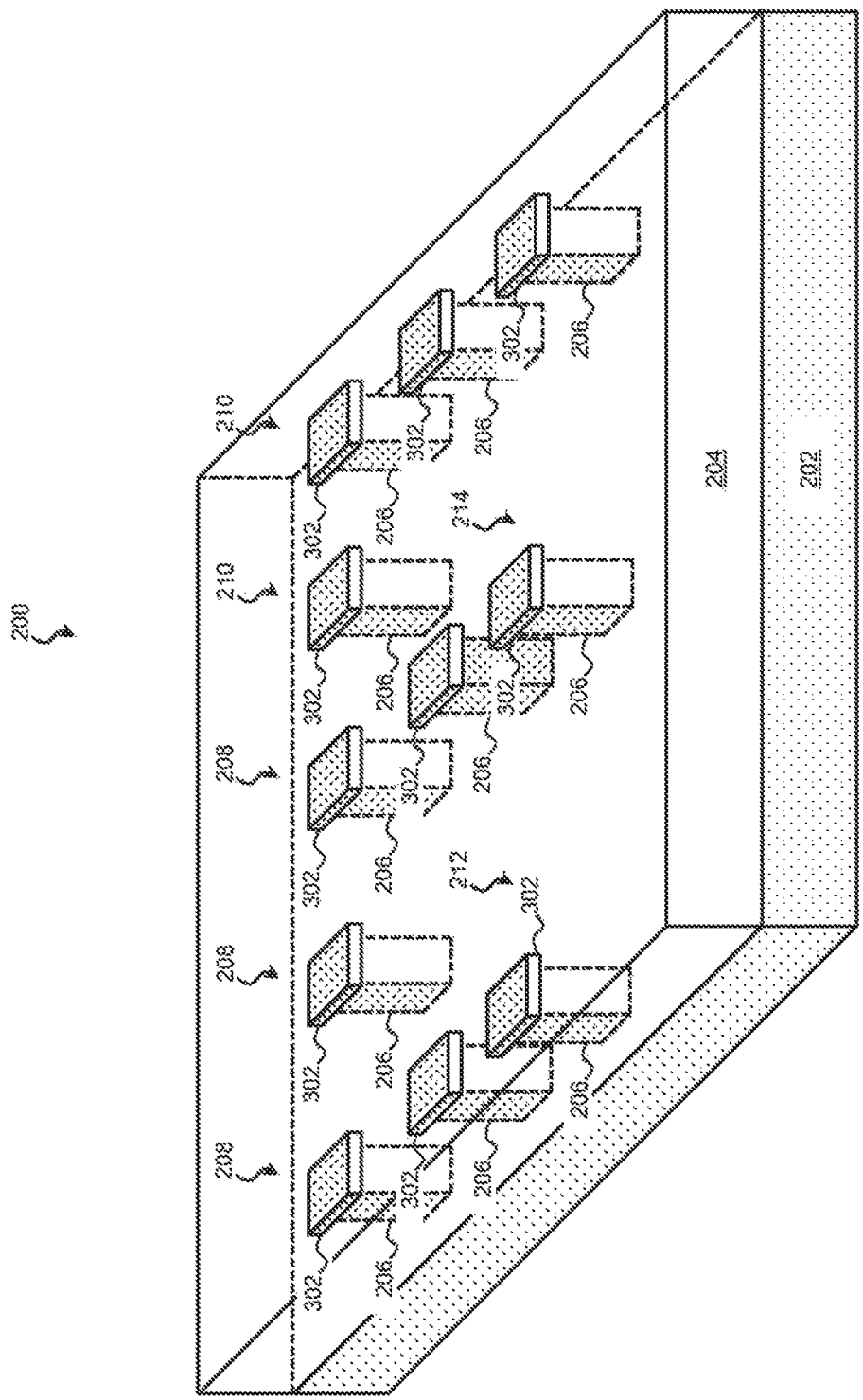

Referring to block 106 of FIG. 1A and to FIG. 3, a first conductive material 302 is deposited on the carrier substrate 202 and within the recesses 206 to define chip I/O via pillars 208, structural pillars 210, passive devices (e.g., inductor 212, capacitor 214, etc.), and other features. The first conductive material 302 may also extend beyond the recesses 206 and may be deposited on un-recessed regions of the dielectric layer 204.

The first conductive material 302 may include any suitable conductive material, and in some embodiments in which the workpiece 200 undergoes a firing process, the first conductive material 302 includes one or more Low-Temperature Co-fired Ceramic (LTCC) or High-Temperature Co-fired Ceramic (HTCC) conductors. Suitable LTCC conductive materials may include a metal (e.g., silver, gold, copper, platinum, palladium, and/or combinations thereof) alone or in combination with one or more solvents, binders, and/or sintering additives. Suitable HTCC conductive materials may include a metal (e.g., molybdenum, tungsten, and/or combinations thereof) with one or more solvents, binders, and/or sintering additives. The particular materials of the first conductive material 302 may be selected based on adherence, firing temperature, shrinkage relative to other materials of the workpiece 200, and/or other considerations.

The first conductive material 302 may be applied using any suitable technique such as screen-printing, stencil printing, and/or inkjetting. In screen printing, a mesh screen is aligned above the workpiece 200. The mesh screen may include an impermeable mask layer on the mesh with openings for the first conductive material 302 to pass through. The first conductive material 302 is applied to the mesh screen in a paste form, and a squeegee or other mechanical force may drive the first conductive material 302 through the openings in the impermeable mask layer in order to deposit the material on selected portions of the workpiece 200. Stencil printing is similar and may include applying the first conductive material 302 in paste form to an impermeable stencil and using mechanical force to drive the first conductive material 302 through openings in the stencil and onto selected portions of the workpiece 200.

In inkjet printing, a print head with one or more printing nozzles is scanned across the workpiece 200. At selected locations on the workpiece 200, a flow control device within the print head, such as a resistive heater or piezoelectric device, causes a small amount of the first conductive material 302 to be expelled from the nozzle and deposited on the workpiece 200. Of course, these techniques for depositing the first conductive material 302 are merely exemplary, and any suitable technique may be used. The first conductive material 302 may include any number of layers of conductive material and may be deposited using multiple iterations of screen-printing, stencil printing, inkjetting, and/or other suitable techniques.

After deposition, the first conductive material 302 may undergo a curing process in order to drive off the solvent or otherwise solidify the first conductive material 302. In various embodiments, the curing process includes applying heat to and/or blowing air on the workpiece 200 and the first conductive material 302.

Figure 4:
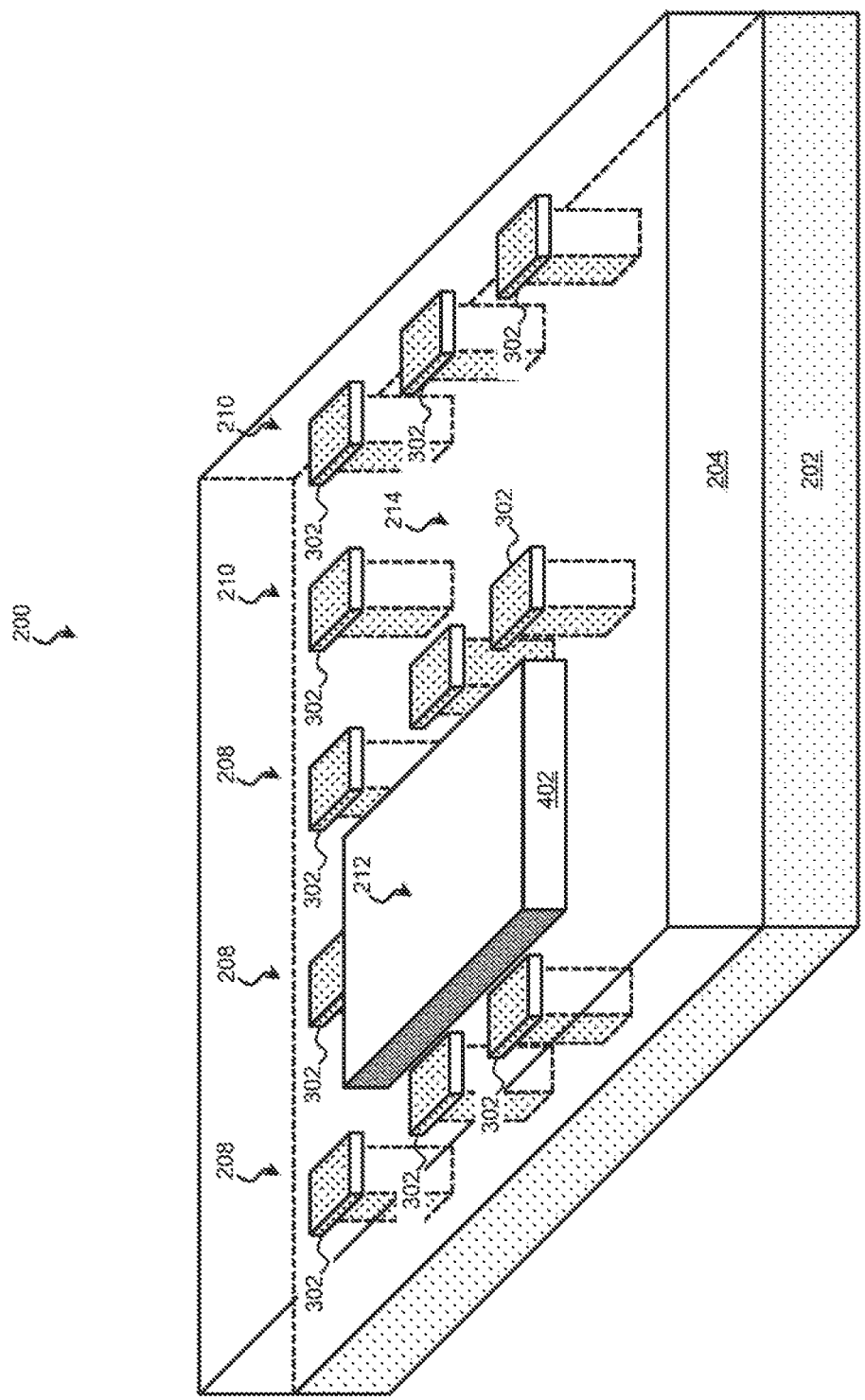

Referring to block 108 of FIG. 1A and to FIG. 4, a first or bottom magnetic material 402 is deposited on the dielectric layer 204. As shown in the figures that follow, the bottom magnetic material 402 may be used to form an inductor 212 on the workpiece 200. The bottom magnetic material 402 may include any number of layers of any suitable material including any suitable LTCC or HTCC material(s). The bottom magnetic material 402 may be applied using any suitable technique such as screen-printing, stencil printing, and/or inkjetting, and may undergo a curing process substantially as described above after deposition upon the workpiece 200.

Figure 5:
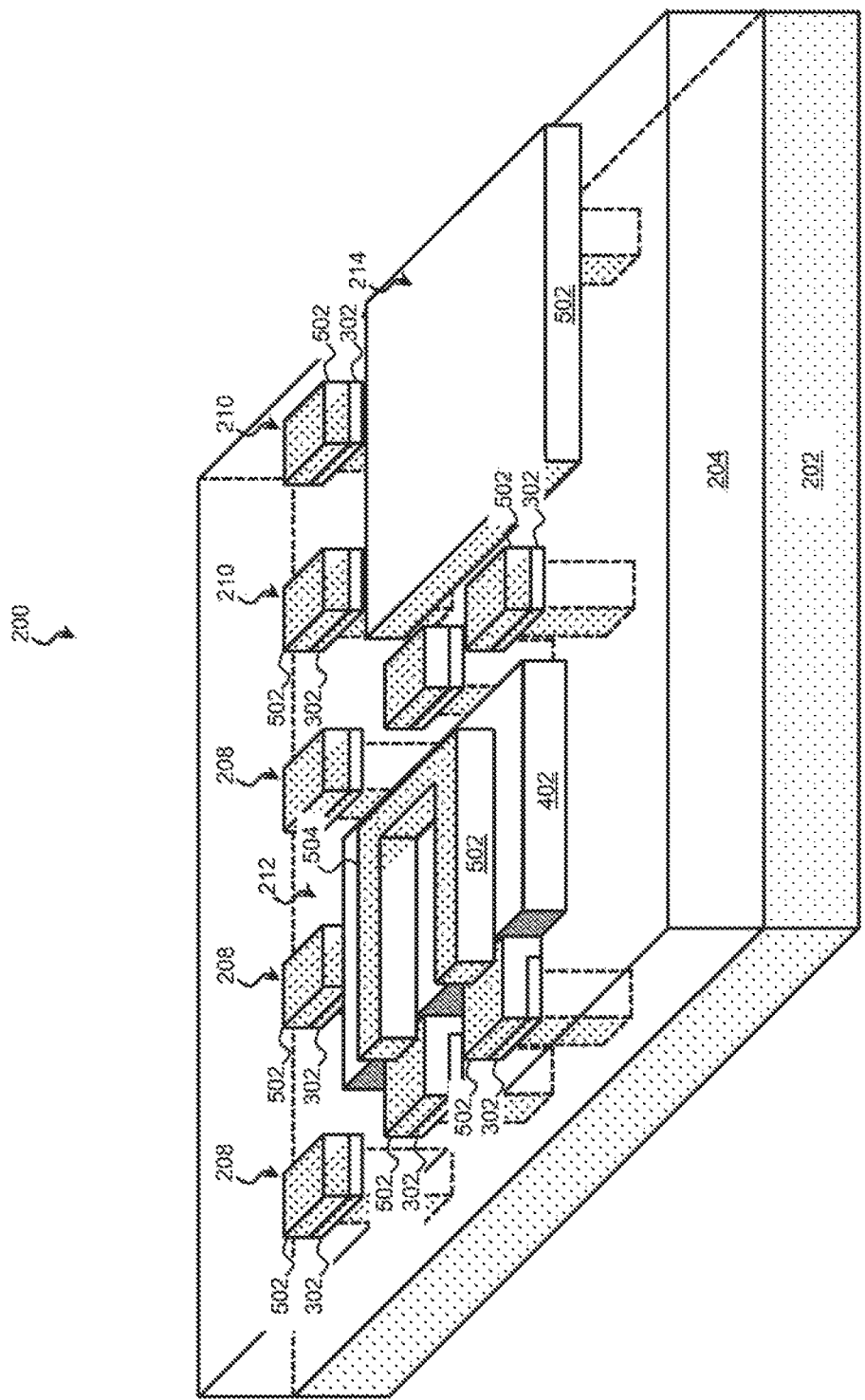

Referring to block 110 of FIG. 1A and to FIG. 5, a second conductive material 502 is applied to the workpiece 200. The second conductive material 502 is on deposited on the first conductive material 302 to further define the I/O via pillars 208 and/or structural pillars 210. In the illustrated embodiment, the second conductive material 502 is also applied to the dielectric layer 204 to define a bottom plate of a capacitor 214 and applied on top of the bottom magnetic material 402 to define a loop 504 of an inductor 212. To avoid shorting the loop 504, in embodiments in which the bottom magnetic material 402 is conductive, any suitable dielectric (e.g., LTCC and/or HTCC dielectrics) may be formed on the bottom magnetic material 402 to separate and insulate the second conductive material 502.

The second conductive material 502 may include any suitable material including LTCC and/or HTCC conductors and may be similar in composition to the first conductive material 302. In alternate embodiments, the second conductive material is different in composition from the first conductive material. The second conductive material 502 may be applied using any suitable technique including screen-printing, stencil printing, and/or inkjetting. The second conductive material 502 may include any number of layers of conductive material and may be deposited using multiple deposition iterations. After applying the second conductive material 502, a curing process, such as that described above, may be performed.

Figure 6:
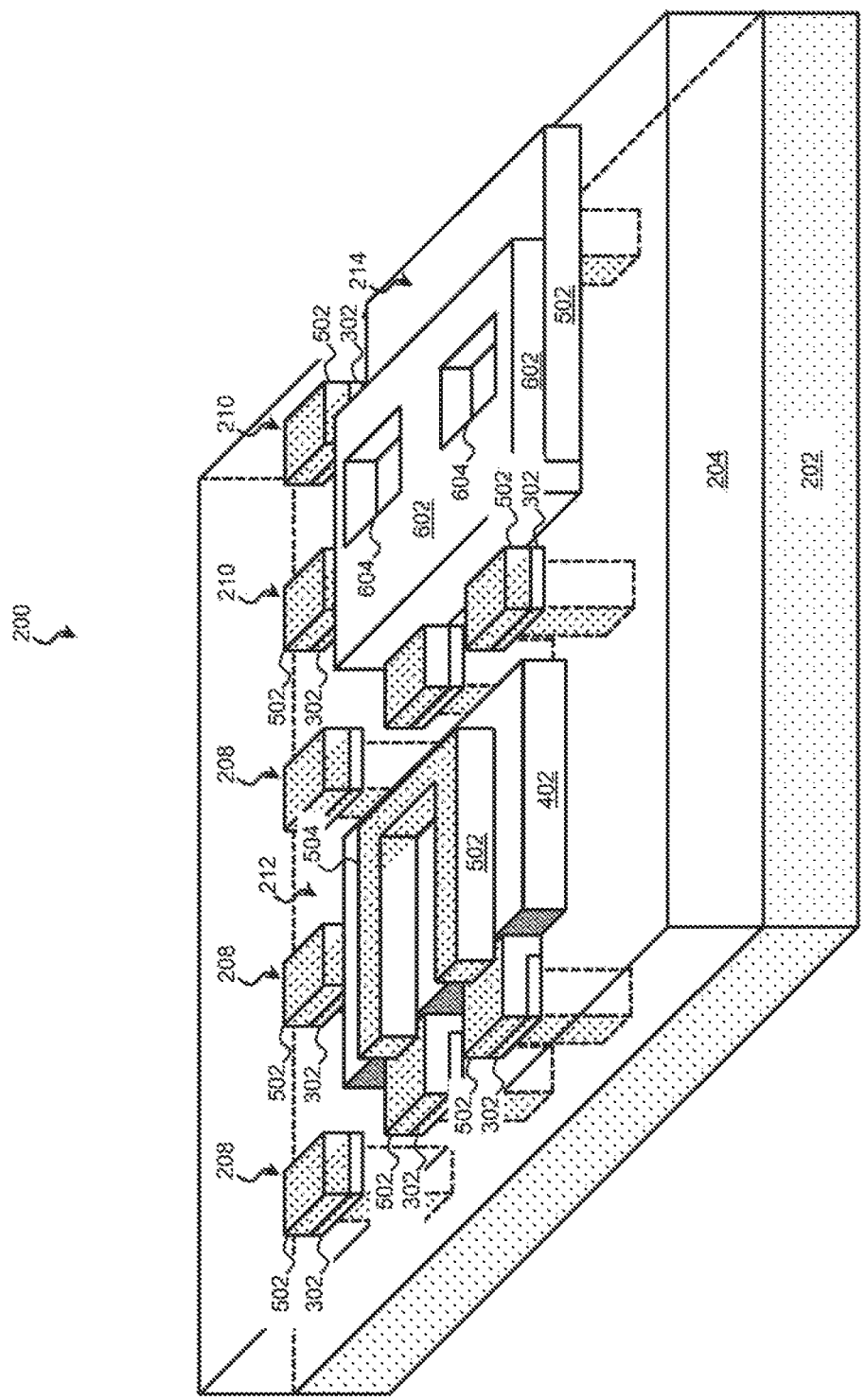

Referring to block 112 of FIG. 1A and to FIG. 6, a capacitor dielectric 602 is applied to the workpiece 200. The capacitor dielectric 602 is applied to the bottom plate of the capacitor 214 and may extend beyond the bottom plate along one or more sides of the bottom plate. In the illustrated embodiment, the capacitor dielectric material includes one or more openings 604 allowing contact to be made to the bottom plate. By forming contacts in a central region of the bottom plate, the resistance of the capacitor 214 may be reduced compared to similar capacitors with side contacts, but the central openings 604 may also reduce the total capacitance. Accordingly, the capacitor may include any number of central contacts (including zero) as well as any number of side contacts depending on the design objectives.

The capacitor dielectric 602 may include any suitable dielectric material. Dielectric materials are commonly characterized by their dielectric constant relative to silicon dioxide, and accordingly, the capacitor dielectric may include an LTCC or HTCC high-k dielectric material. The capacitor dielectric 602 may include any number of layers of dielectric material, each of which may be applied using any suitable technique including screen-printing, stencil printing, and/or inkjetting. Deposition of the capacitor dielectric 602 may be followed by a curing process to evaporate a solvent within the dielectric.

Figure 7:
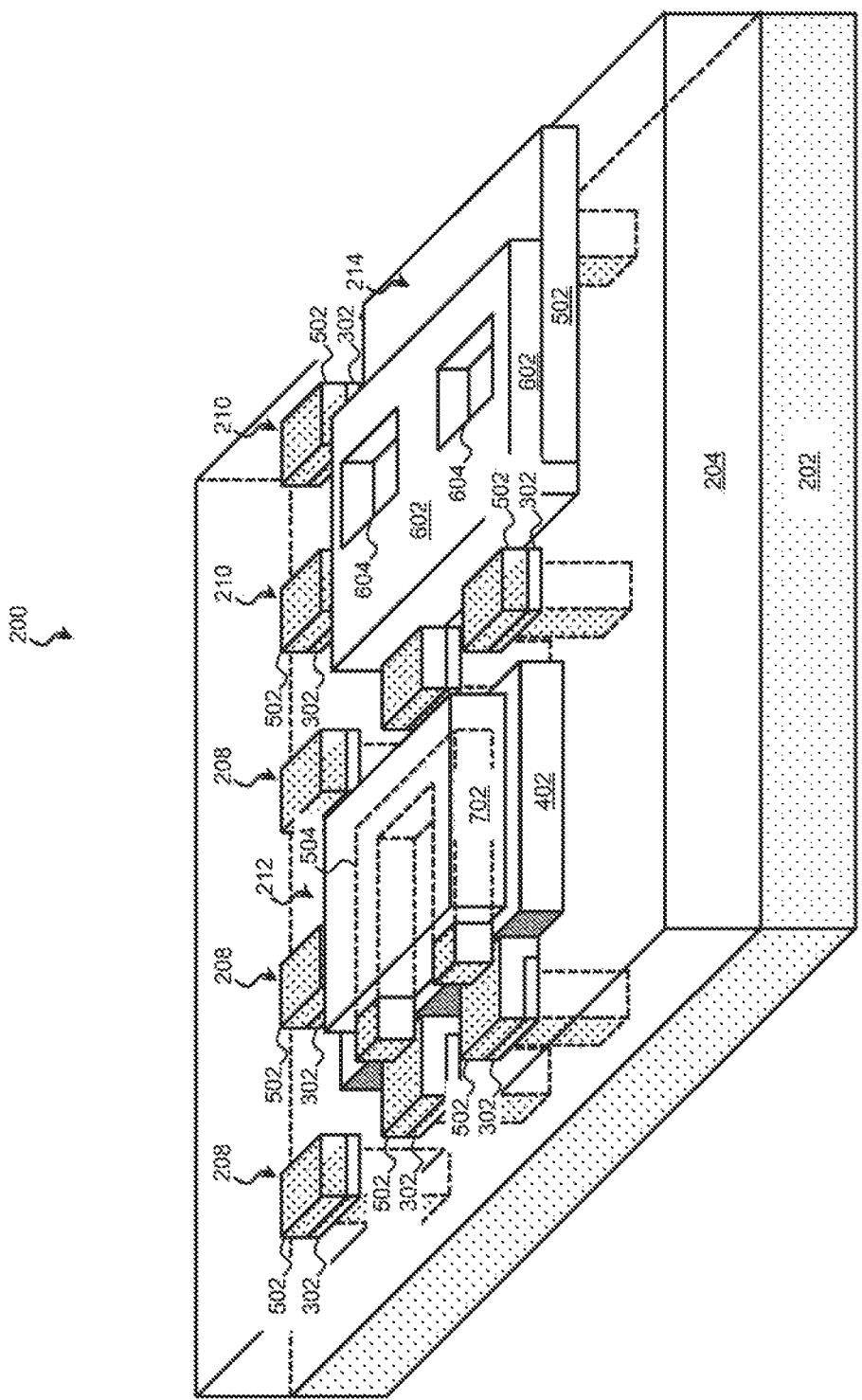

Referring to block 114 of FIG. 1A and to FIG. 7, an optional inductor dielectric 702 is applied to the workpiece 200. The inductor dielectric 702 is applied on the bottom magnetic material 402 and surrounds the second conductive material 502 of the inductor loop 504. The inductor dielectric 702 may be used to adjust the performance of the inductor 212 by increasing saturation current of the inductor 212 but at the expense of a lower total inductance. Accordingly, various embodiments include or omit the inductor dielectric 702 based on design objectives. The inductor dielectric 702 may include any number of layers of any suitable material including LTCC and/or HTCC dielectrics, and may be deposited by any suitable technique including screen printing, stencil printing, and/or inkjetting. After depositing the inductor dielectric 702, a curing process may be performed to solidify the inductor dielectric 702.

Figure 8:
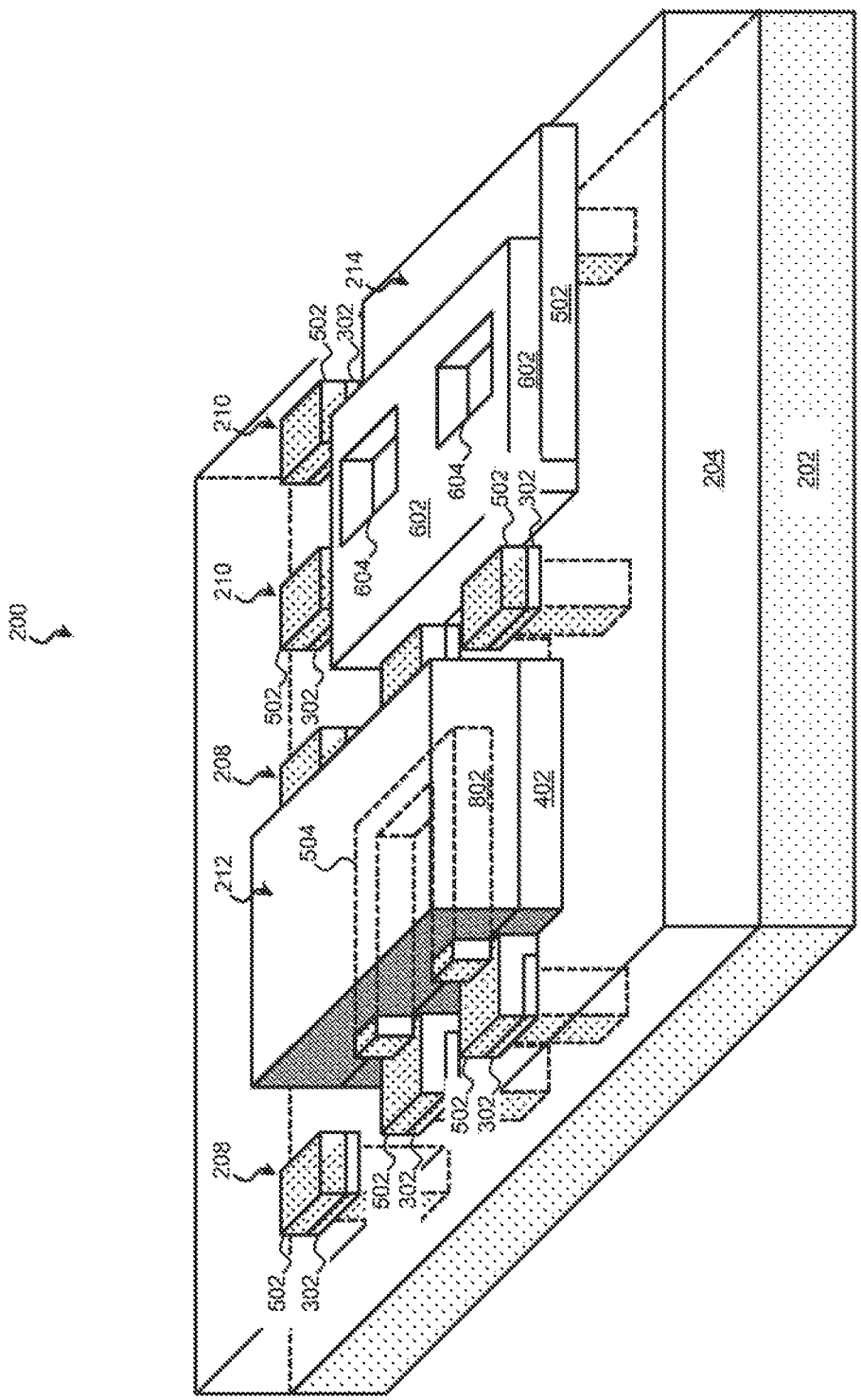
Figure 9A:
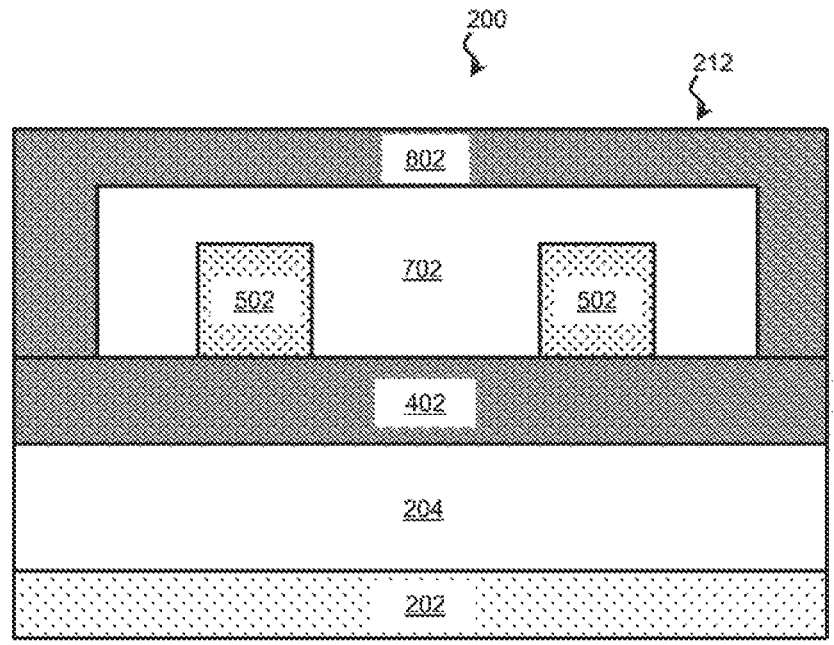
FIGS. 9A and 9B are cross-sectional views of an inductor region of the workpiece undergoing the method according to various aspects of the present disclosure.
Figure 9B:
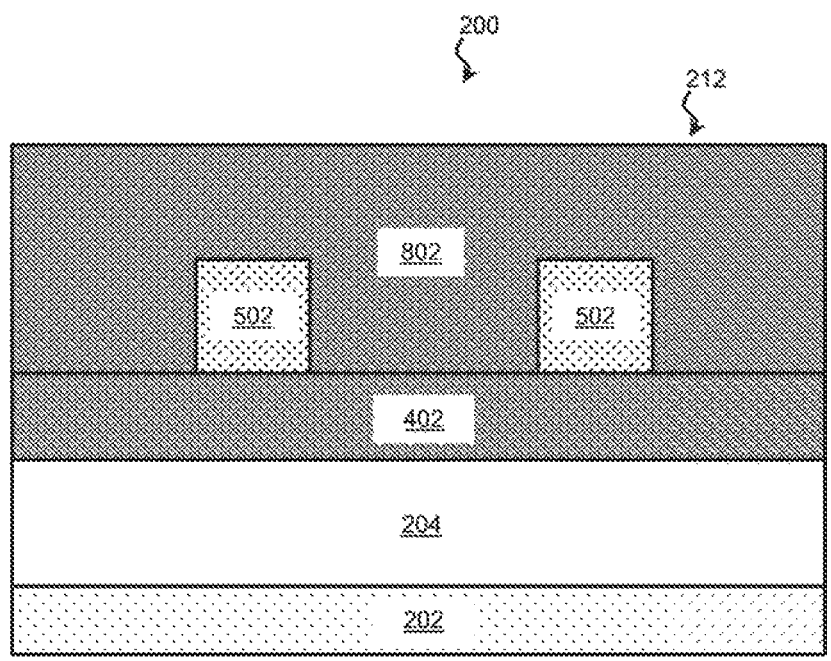

Referring to block 116 of FIG. 1A and to FIGS. 8, 9A, and 9B, a second or top magnetic material 802 is deposited on the loop 504 and the inductor dielectric 702, if present. FIGS. 9A and 9B are cross sectional views of the workpiece 200 taken through the inductor 212 and show embodiments with and without an inductor dielectric 702, respectively. Referring first to FIG. 9A, the inductor dielectric 702 is deposited on and may contact a top surface and both side surfaces of both portions of second conductive material 502 of the loop, substantially as described in block 114. The top magnetic material 802 is then deposited on top of the inductor dielectric 702, substantially as described in block 116. Referring next to FIG. 9B, the top magnetic material 802 is deposited on and may contact the top surface and both side surfaces of both portions of the second conductive material 502 of the loop, substantially as described in block 116.

In many embodiments, the top magnetic material 802 is similar in composition to the bottom magnetic material 402, however in alternate embodiments, the top magnetic material 802 has a different composition. Suitable materials for the top magnetic material 802 include both LTCC and HTCC magnetic materials. In embodiments in which the top magnetic material 802 is conductive, any suitable dielectric (e.g., LTCC and/or HTCC dielectrics) may be formed on second conductive material 502 to separate it from the top magnetic material 802. This dielectric may be independent of the inductor dielectric 702, if any. The top magnetic material 802 may include any number of layers of magnetic material, each of which may be applied using any suitable technique including screen-printing, stencil printing, and/or inkjetting. The application of the top magnetic material 802 may be followed by a curing process to drive off a solvent and leave the top magnetic material 802 in a more solid form.

Figure 10:
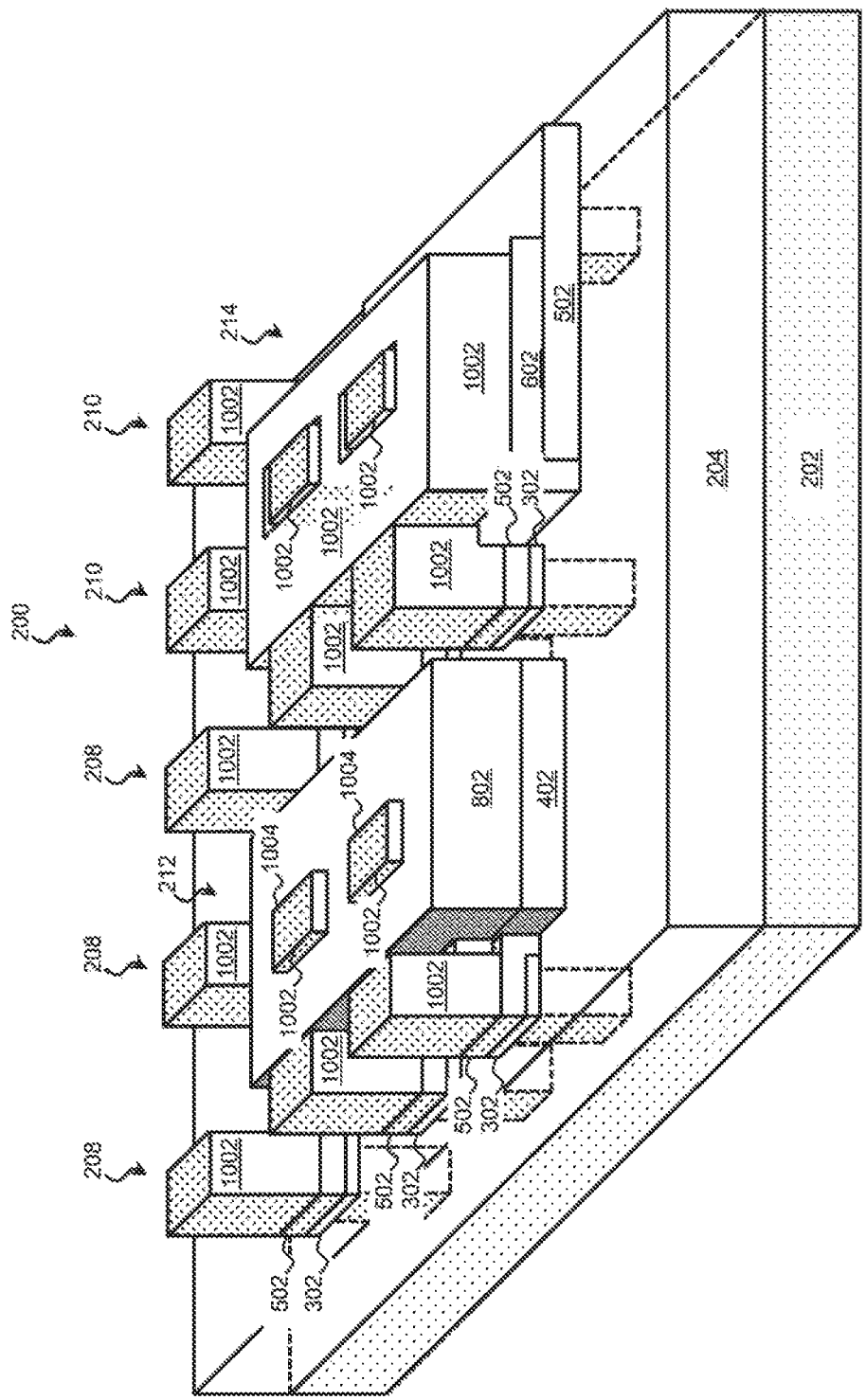
FIG. 10 is a perspective view of a portion of a workpiece undergoing the method according to various aspects of the present disclosure.
Figure 11:
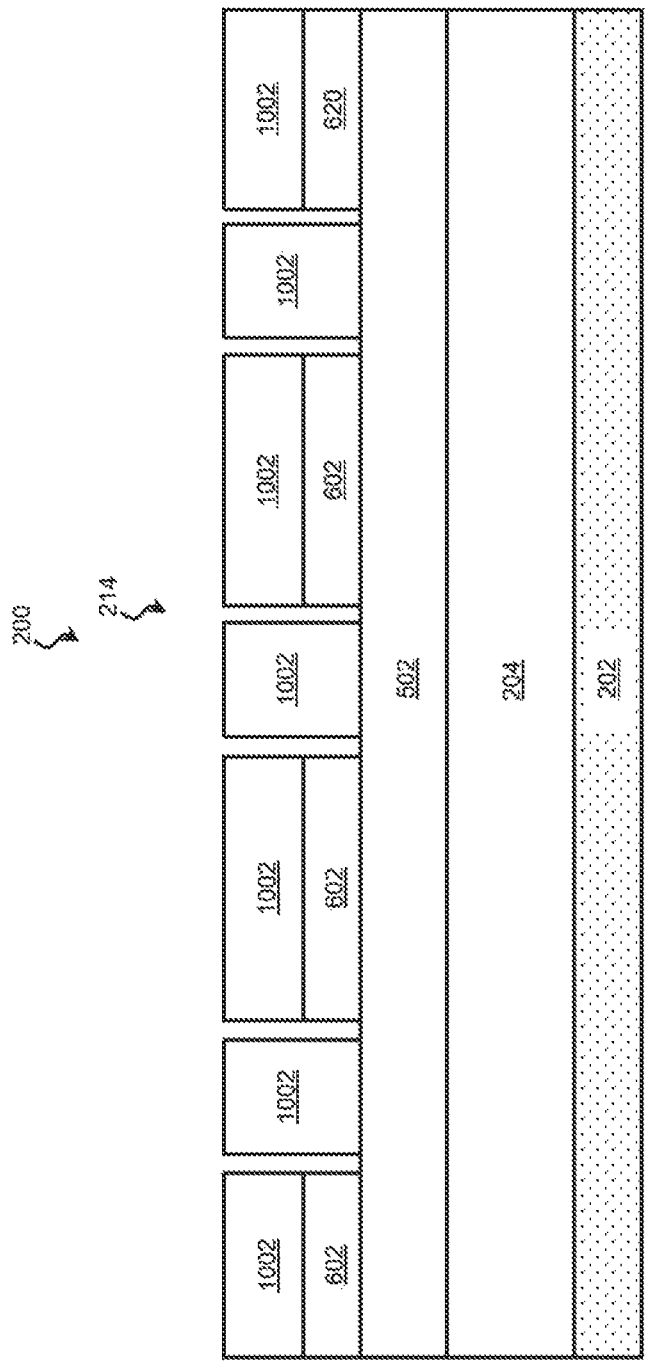
FIG. 11 is a cross-sectional view of a capacitor region of the workpiece undergoing the method according to various aspects of the present disclosure.

Referring to block 118 of FIG. 1A and to FIGS. 10 and 11, a third conductive material 1002 is applied to the workpiece 200. The third conductive material 1002 is on deposited on the second conductive material 502 to further define the I/O via pillars 208 and/or structural pillars 210. In some embodiments, the workpiece 200 includes an additional type of structural pillar 1004 where the third conductive material 1002 is deposited on the top magnetic material 802 of the inductor without necessarily making electrical contact with the inductor 212.

The third conductive material 1002 may also be applied to the capacitor dielectric 602 to define a top plate of the capacitor 214 and/or applied through the openings 604 in the capacitor dielectric 602 to form contacts electrically coupled to the bottom plate.

The third conductive material 1002 may be similar in composition to the first conductive material 302 and/or second conductive material 502. Suitable materials for the third conductive material 1002 include both LTCC and HTCC conductors. The third conductive material 1002 may include any number of layers applied using any suitable technique including screen-printing, stencil printing, and/or inkjetting. After applying the third conductive material 1002, a curing process, such as that described above, may be performed in order to solidify the third conductive material 1002.

FIG. 11 is a cross-sectional view of the workpiece 200 showing the capacitor 214 at this stage of the method 100.

As can be seen, the capacitor 214 includes the bottom plate formed of the second conductive material 502 and disposed on the dielectric layer 204. The capacitor dielectric 602 is disposed on the bottom plate and, in the illustrated embodiment, includes openings for contacts to couple to the bottom plate. The top plate is formed of the third conductive material 1002 and disposed on the capacitor dielectric 602. Other portions of the third conductive material 1002 may also extend through the top plate and the openings in the capacitor dielectric 602 to form contacts electrically coupled to the bottom plate.

Referring to block 120 of FIG. 1B, the workpiece 200 is fired in a thermal process. The temperature, duration, atmosphere, and other parameters of the thermal process may be determined in part based on the materials of the workpiece including those of the first, second, and third conductive materials, the top and bottom magnetic materials, the capacitor dielectric, and/or the inductor dielectric. For example, suitable LTCC firing temperatures are generally at or below 1000° C., while HTCC firing temperature are generally at or above 1500° C.

Accordingly, in an embodiment in which the workpiece 200 includes low-temperature co-fired ceramic materials, the firing process begins by slowly heating the workpiece 200 to drive off any remaining solvents. This phase may be referred to as debinding. After debinding, the workpiece is heated further to a peak temperature below or substantially equal to 1000° C. At the peak temperature, chemical changes may occur within the materials of the workpiece 200. For example, glass-like components of the workpiece 200 may melt and flow while metals and ceramic particles may sinter and combine. When the workpiece 200 is later cooled, materials within the workpiece 200 crystallize producing a unified structure that is both firm and stable.

In an exemplary embodiment in which the workpiece 200 includes high-temperature co-fired ceramic materials, a similar firing process is performed at a peak temperature above or substantially equal to 1500° C. In contrast to some LTCC examples, which may fire the workpiece 200 in an ambient air environment, HTCC firing processes are more likely to take place in an oxygen-free atmosphere, such as an argon environment or a vacuum.

Figure 12:
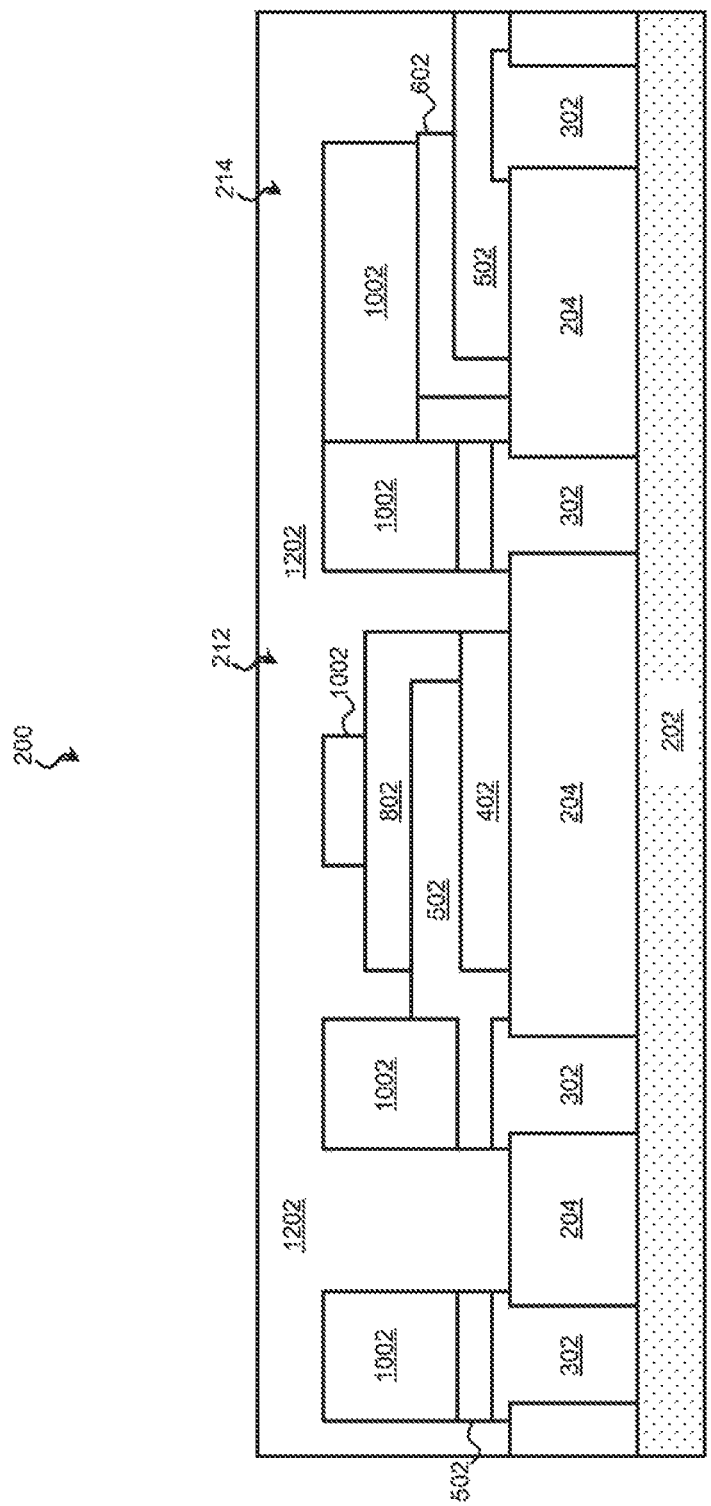
FIGS. 12-16 are cross-sectional views of the workpiece undergoing the method according to various aspects of the present disclosure.

Referring to block 122 of FIG. 1B and to FIG. 12, an encapsulating dielectric 1202 is applied to the workpiece 200 to provide protection and physical support for the other materials and layers. The encapsulating dielectric 1202 may include any suitable dielectric such as a semiconductor oxide, a semiconductor nitride, a semiconductor oxynitride, a semiconductor carbide, a polymer dielectric, and/or a combination thereof. The encapsulating dielectric 1202 may be applied to the workpiece 200 by any suitable technique including spin-on deposition, liquid deposition (e.g., spray, dip, etc.), chemical vapor deposition (CVD), physical vapor deposition (PVD), and/or any other suitable deposition technique.

Figure 13:
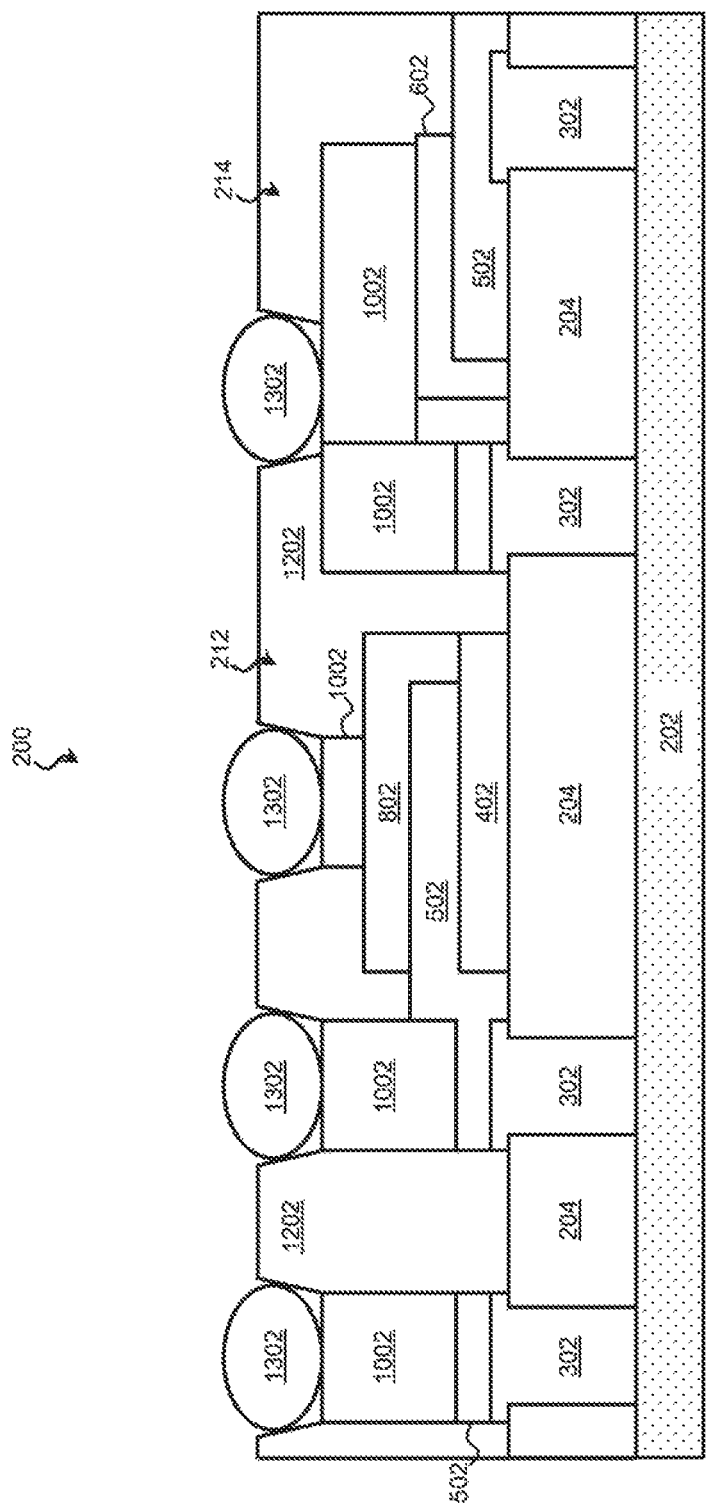

Referring to block 124 of FIG. 1B and to FIG. 13, the encapsulating dielectric 1202 may be patterned to expose the third conductive material 1002 in regions corresponding to I/O via pillars 208, structural pillars 210 and 1004, device contacts including contacts of the inductor 212 and/or capacitor 214, and/or other regions to be bonded to the circuit device. The patterning of the encapsulating dielectric 1202 may be performed using photolithography, direct-write lithography, and/or any other suitable patterning technique. In an embodiment, a photosensitive resist is applied to the encapsulating dielectric 1202, exposed in a lithographic process, and developed to form a pattern that exposes portions of the encapsulating dielectric 1202 to be etched. The exposed portions of the encapsulating dielectric are subsequently etched using any suitable etching technique including wet etching, dry etching, reactive ion etching, ashing, and/or other suitable technique.

Referring to block 126 of FIG. 1B and referring still to FIG. 13, bonding structures 1302 are formed within the etched portions of the encapsulating dielectric 1202 and coupled to the I/O via pillars 208, structural pillars 210, inductor 212 contacts, capacitor 214 contacts, and/or other regions of the third conductive material 1002. The bonding structures 1302 may include plates, solder balls, and/or solder bumps, and may include one or more bonding metals, such as gold (Au), gold tin (AuSn), gold indium (AuIn), and/or other suitable metals to achieve an eutectic bond. The bonding structures 1302 may be formed by evaporation, electroplating, printing, jetting, stud bumping, or other suitable techniques.

Figure 14:
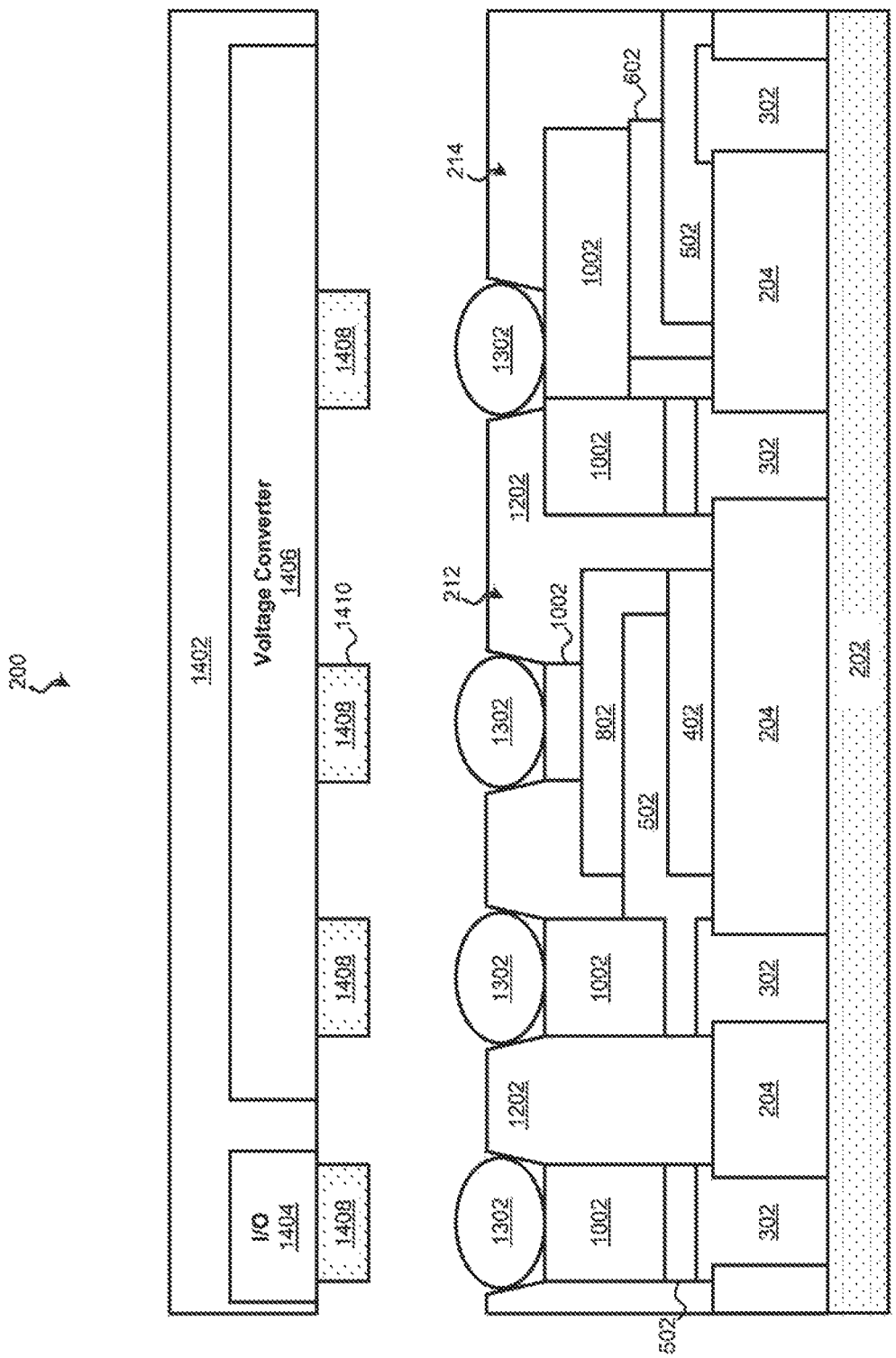

Referring to block 128 of FIG. 1B and to FIG. 14, a circuit substrate 1402 is received. The circuit substrate 1402 represents any device that may be bonded to the workpiece 200 and may contain one or more integrated circuits to be electrically coupled by the bonding process. An exemplary circuit substrate 1402 is a semiconductor wafer including an elementary semiconductor (e.g., silicon, germanium, etc.) and/or a compound semiconductor (e.g., silicon germanium, silicon carbide, gallium arsenic, gallium phosphide, indium phosphide, indium arsenide, indium antimonide, etc.). The circuit substrate 1402 may have various circuit elements formed upon it including field-effect transistors (FETs), bipolar-junction transistors (BJTs), light-emitting diodes (LEDs), memory devices, a high power transistors, and/or other suitable circuit elements. In the illustrated embodiments, the circuit elements make up an I/O transceiver 1404 and a voltage converter 1406, such as a buck converter, although these are merely some examples of the wide variety of circuits that may be formed upon the circuit substrate 1402.

The circuit substrate 1402 may also include bonding structures 1408. Substantially similar to the bonding structures 1302 of the carrier substrate 202, the bonding structures 1408 may include plates, solder balls, or solder bumps, and may include one or more bonding metals, such as gold (Au), gold tin (AuSn), gold indium (AuIn), and/or other suitable bonding metals to achieve an eutectic bond. Some of the bonding structures 1408 may constitute dummy pads 1410 that provide structural support without necessarily providing an electrical connection to a circuit element of the circuit substrate. The bonding structures 1408 of the circuit substrate 1402 may be identical to the bonding structures 1302 of the carrier substrate 202 or may be complementary. For example, a bonding structure 1302 of the carrier substrate 202 may have a first metal, while a bonding structure 1408 of the circuit substrate 1402 may have a complementary second metal capable of forming a eutectic bond with the first metal. As a further example, either of bonding structure 1302 or bonding structure 1408 may include solder, while the other bonding structure may include a complementary material to which the solder readily adheres.

Figure 15:
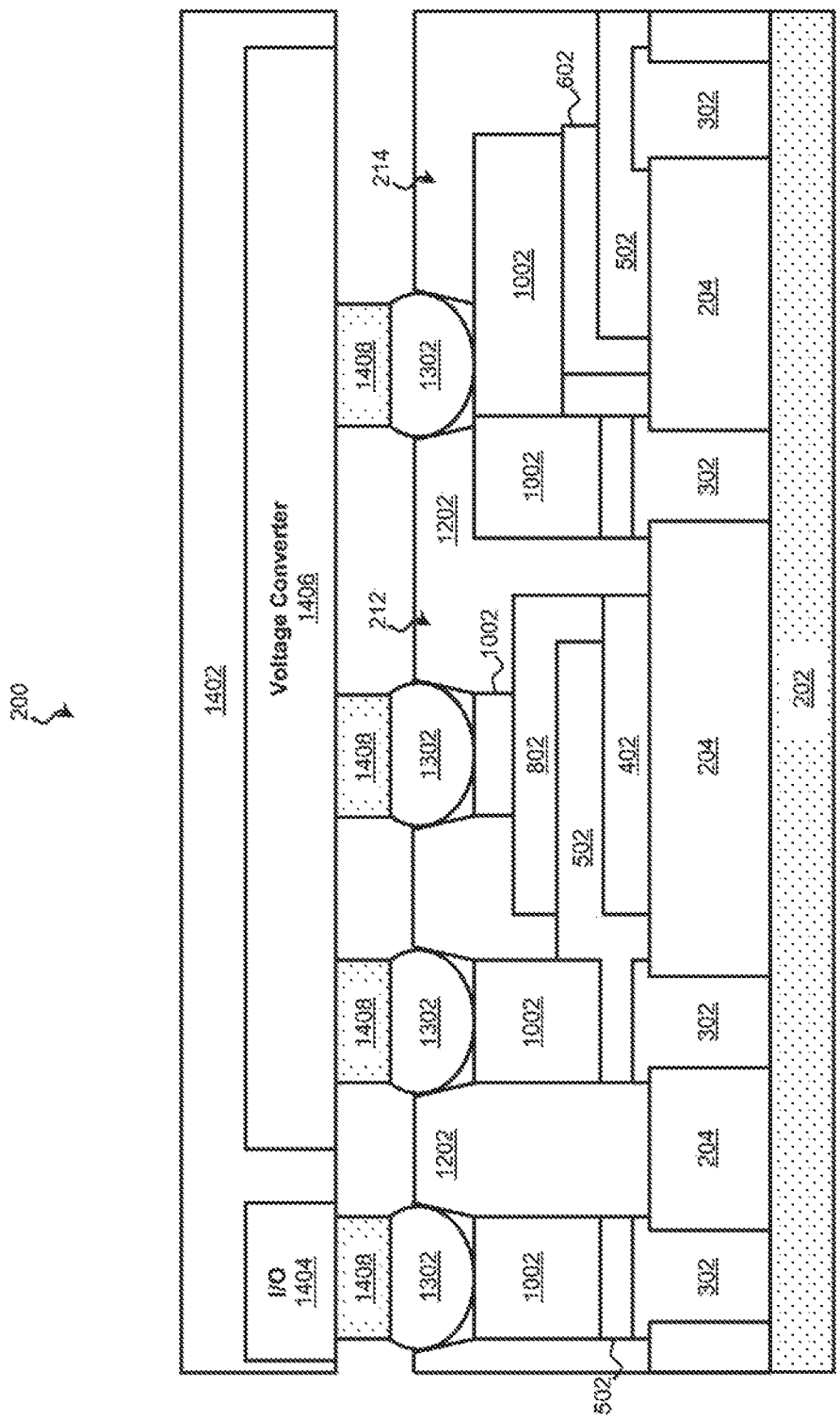

Referring to block 130 of FIG. 1B and to FIG. 15, the circuit substrate 1402 is bonded to the carrier substrate 202. Any suitable bonding technique may be used including soldering and eutectic bonding. In some embodiments, an adhesive is used to secure the circuit substrate 1402 to the carrier substrate 202. The adhesive may include a thermal conductive material to facilitate the transfer of heat away from the circuit substrate 1402.

Figure 16:
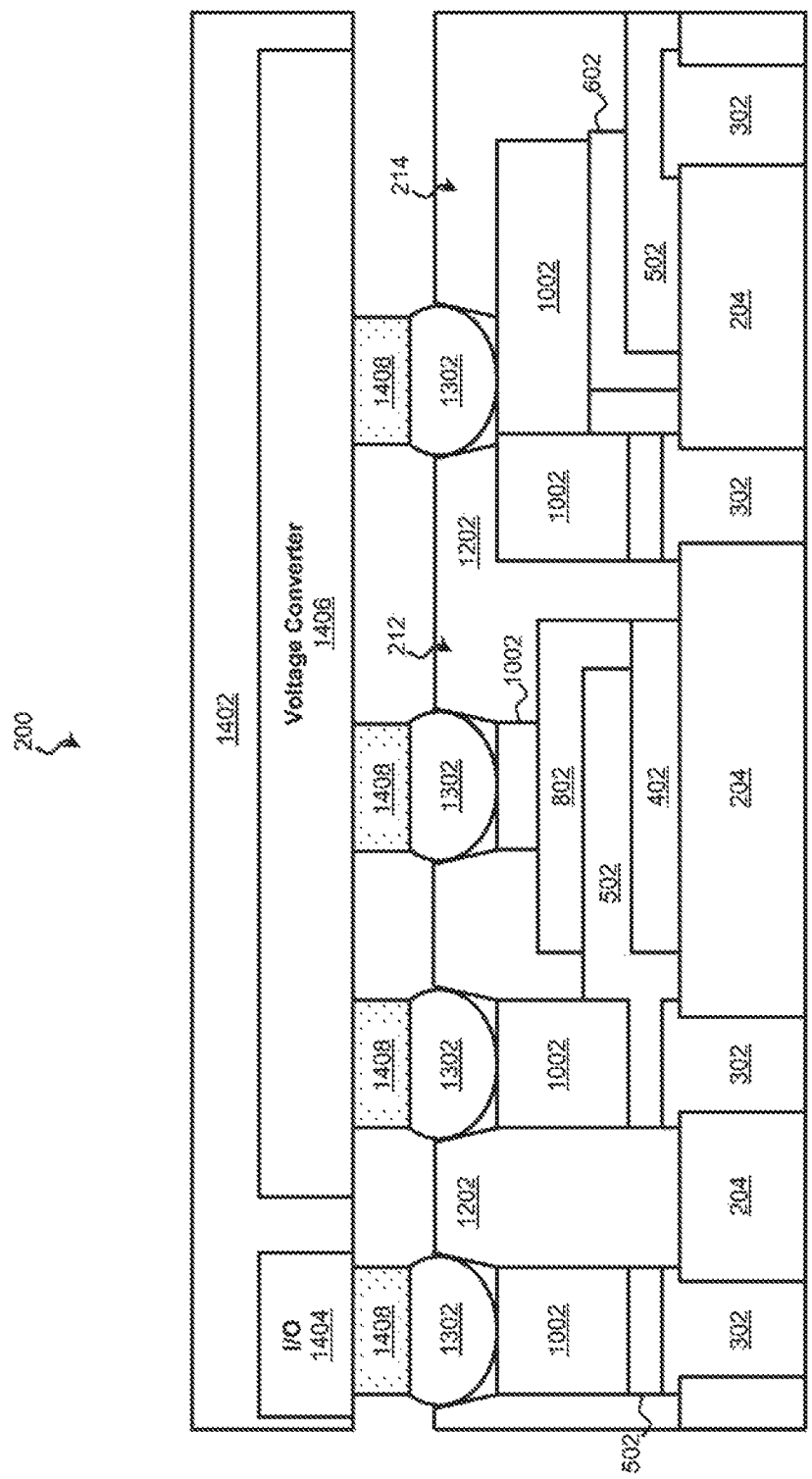

Referring to block 132 of FIG. 1B and to FIG. 16, once the circuit substrate 1402 has been bonded to the workpiece 200, the carrier substrate 202 may be removed by any suitable technique including grinding, polishing (e.g., chemical-mechanical polishing/planarization, etc.), etching, and/or other suitable technique. Referring to block 134 of FIG. 1B, the workpiece 200 may be provided for further fabrication such as dicing and/or packaging.

Figure 17:
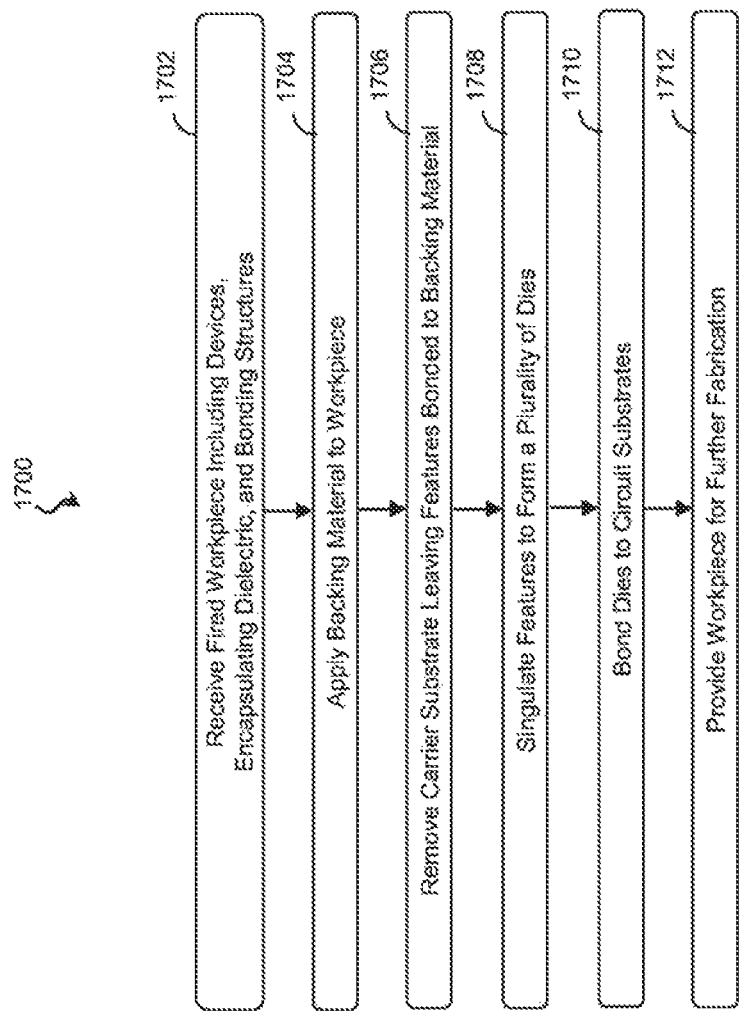
FIG. 17 is a flow diagram of a method of forming circuit devices that singulates a substrate into dies prior to bonding according to various aspects of the present disclosure.

In contrast to some of the preceding examples, in some embodiments, the carrier substrate 202 of the workpiece 200 is diced before being mounted to the circuit substrate 1402. Examples of this technique are described with reference to FIGS. 17-22. In that regard, FIG. 17 is a flow diagram of a method 1700 that singulates devices on the carrier substrate prior to bonding according to various aspects of the present disclosure. It is understood that additional steps can be provided before, during, and after the steps of method 1700, and some of the steps described can be replaced or eliminated for other embodiments of the method. FIGS. 18, 19, 21, and 22 are cross-sectional views of the workpiece 200 undergoing the method according to various aspects of the present disclosure. FIG. 20 is a top view of the workpiece 200 undergoing the method according to various aspects of the present disclosure. For clarity and ease of explanation, some elements of the figures have been simplified.

Figure 18:
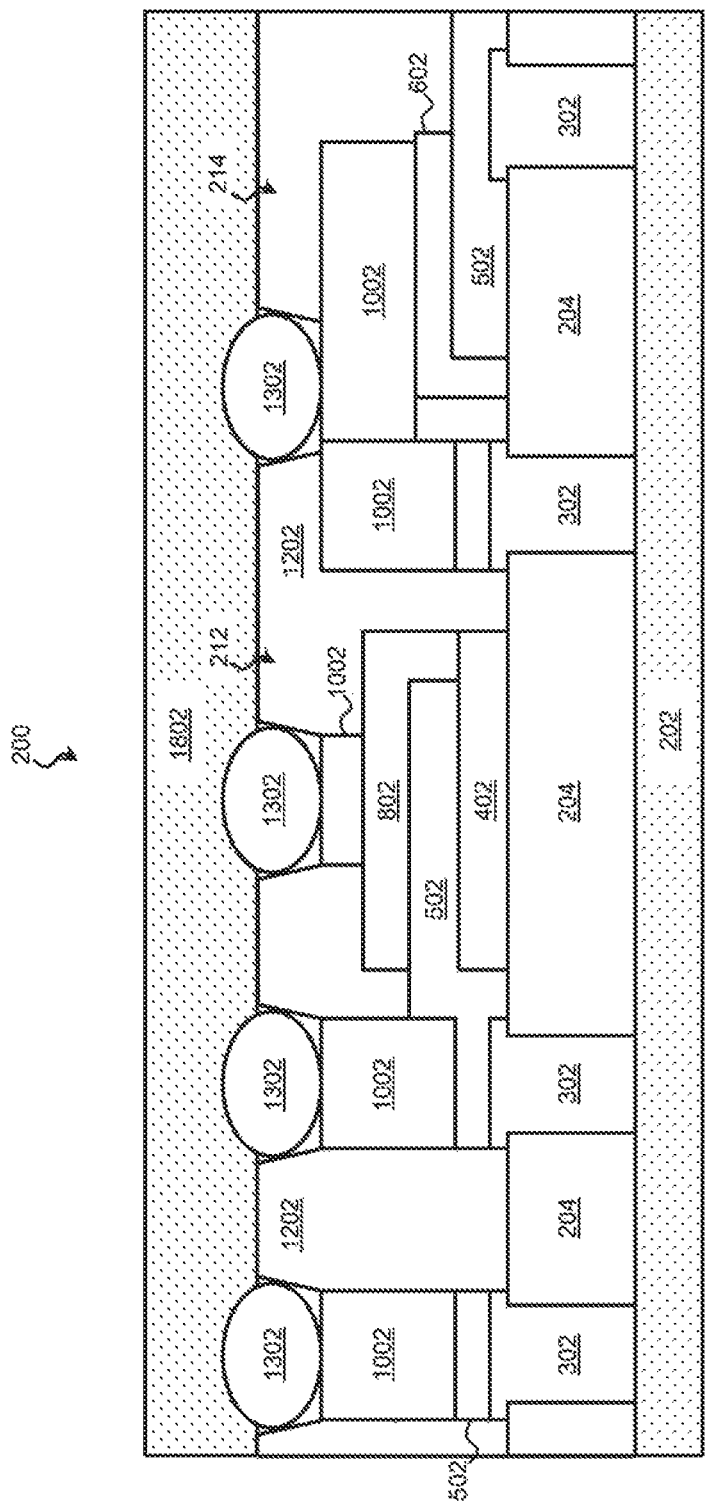
FIGS. 18, 19, 21, and 22 are cross-sectional views of the workpiece undergoing the method according to various aspects of the present disclosure.

Referring to block 1702 of FIG. 17 and to FIG. 18, a workpiece 200 is received that includes various features formed thereupon. The workpiece 200 and the features may be substantially similar to those described in the context of FIGS. 1A-16, and an exemplary workpiece 200 includes a carrier substrate 202, one or more dielectric layers 204, I/O via pillars 208, structural pillars 210, inductors 212, capacitors 214, conductive materials (e.g., conductive materials 302, 502, 1002, etc.), magnetic materials (e.g., magnetic materials 402, 802, etc.), capacitor dielectric 602, inductor dielectric 702, encapsulating dielectric 1202, and bonding structures 1302 each substantially similar to that described above. The workpiece 200 may be formed by any suitable technique including that of blocks 102-126 of FIGS. 1A-1B.

Referring to block 1704 of FIG. 17 and referring still to FIG. 18, a backing material 1802 may be applied to the workpiece 200 opposite the carrier substrate 202. The backing material 1802 may help control and manipulate the workpiece 200 during grinding, dicing, and/or other mechanical operations, and suitable backing materials 1802 include plasticized PVC adhesive tape (e.g., "blue tape"). To improve the adhesion of the backing material 1802, some processes involved in forming the bonding structures 1302, such as applying solder or forming protrusions, may be reserved until after the backing material 1802 has been applied, utilized, and removed.

Figure 19:
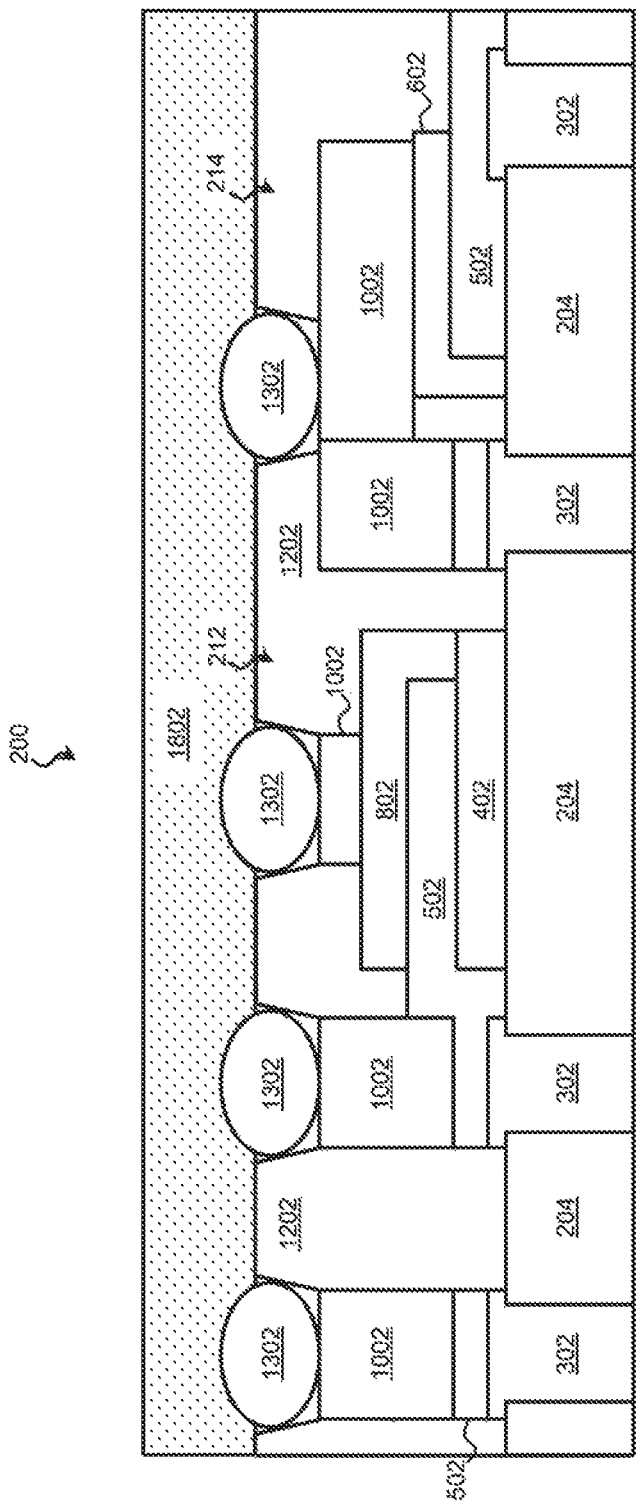
Figure 20:
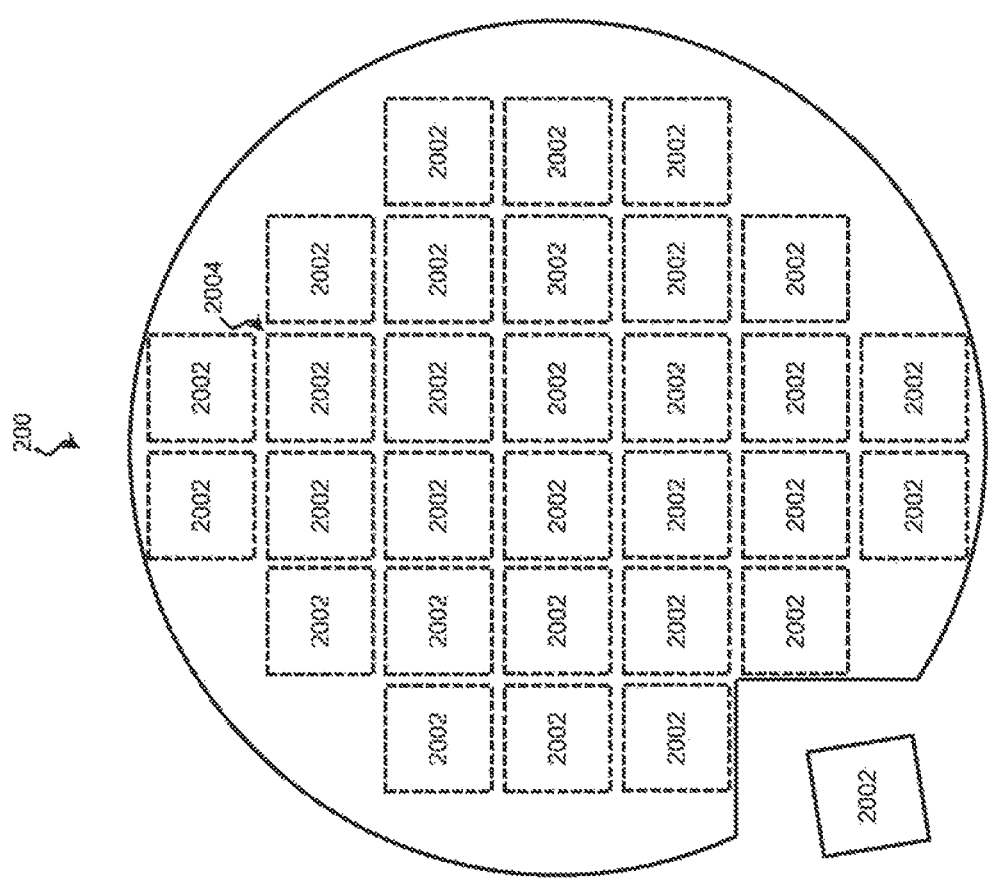
FIG. 20 is a top view of the workpiece undergoing the method according to various aspects of the present disclosure.

Referring to block 1706 of FIG. 17 and to FIG. 19, the carrier substrate 202 is removed substantially as described in block 132 of FIG. 1B. In that regard, the carrier substrate 202 may be removed by any suitable technique including grinding, polishing (e.g., CMP, etc.), etching, and/or other suitable technique. The backing material 1802 may be removed after the carrier substrate 202 is removed or the backing material 1802 may remain in place for use during the dicing process.

Referring to block 1708 of FIG. 17 and to FIG. 20, the carrier substrate 202 is divided into a plurality of dies 2002, thereby singulating the sets of I/O via pillars 208, structural pillars 210, inductors 212, capacitors 214, and other features into discrete dies 2002. In many embodiments, each die 2002 contains those I/O via pillars 208, structural pillars 210, inductors 212, capacitors 214, and other features to be bonded to a single circuit chip. To facilitate singulation, the carrier substrate 202 may include scribe lines 2004, sacrificial areas intended to be used during the dicing process. Accordingly, in an embodiment, a diamond saw is run down the scribe lines 2004 to separate the dies 2002. The scribe lines 2004 are large enough to minimize damage caused to the dies 2002 by the saw. Additionally or in the alternative, etching and/or mechanical force may be used to separate the dies 2002. The dies 2002 may be transferred to a tray or die carrier to await further processing. If the backing material 1802 was not removed prior to singulation, it may be removed at this point. Any remaining processes in the formation of the bonding structures 1302 such as applying solder bumps may also be performed at this point.

Figure 21:
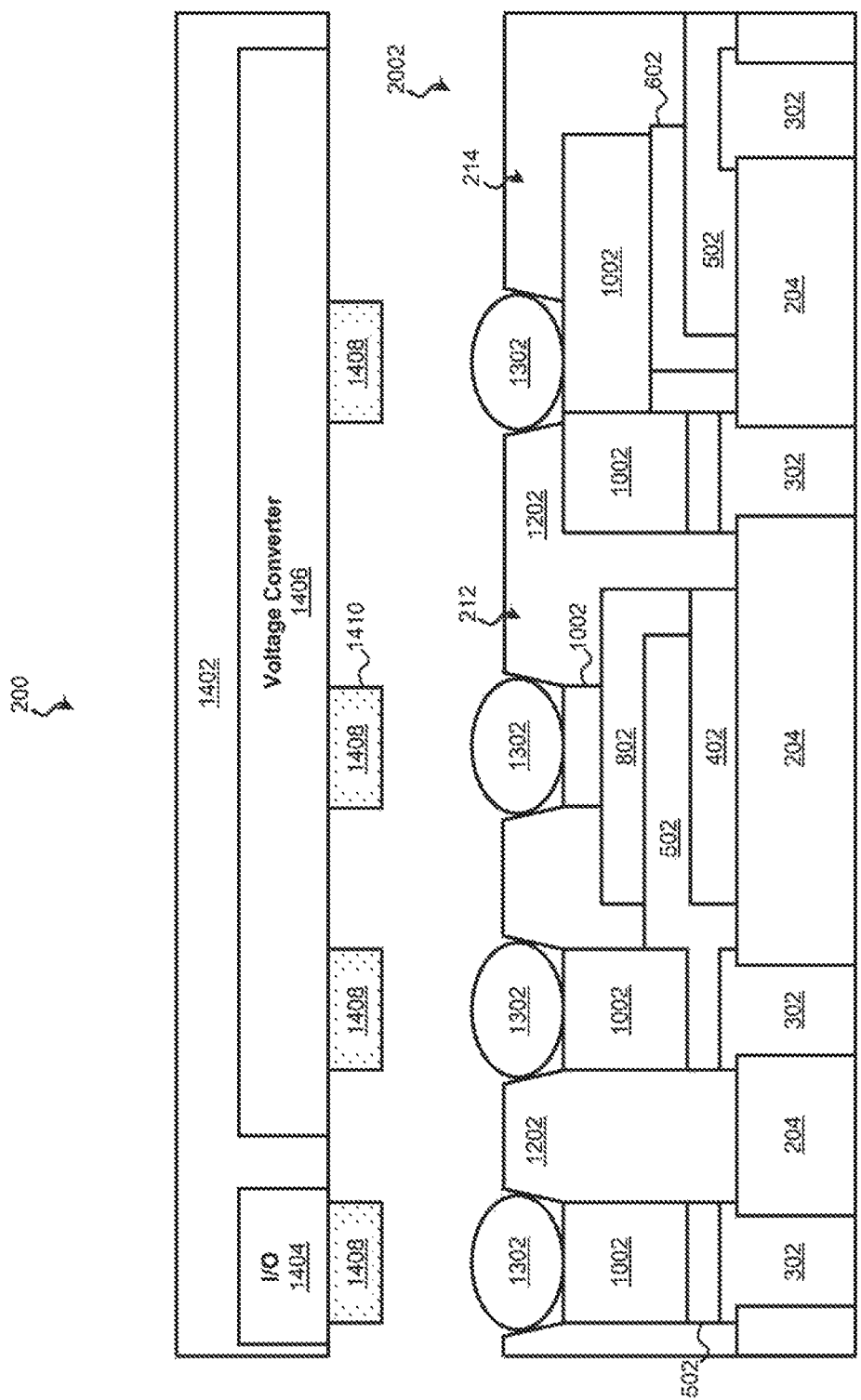
Figure 22:
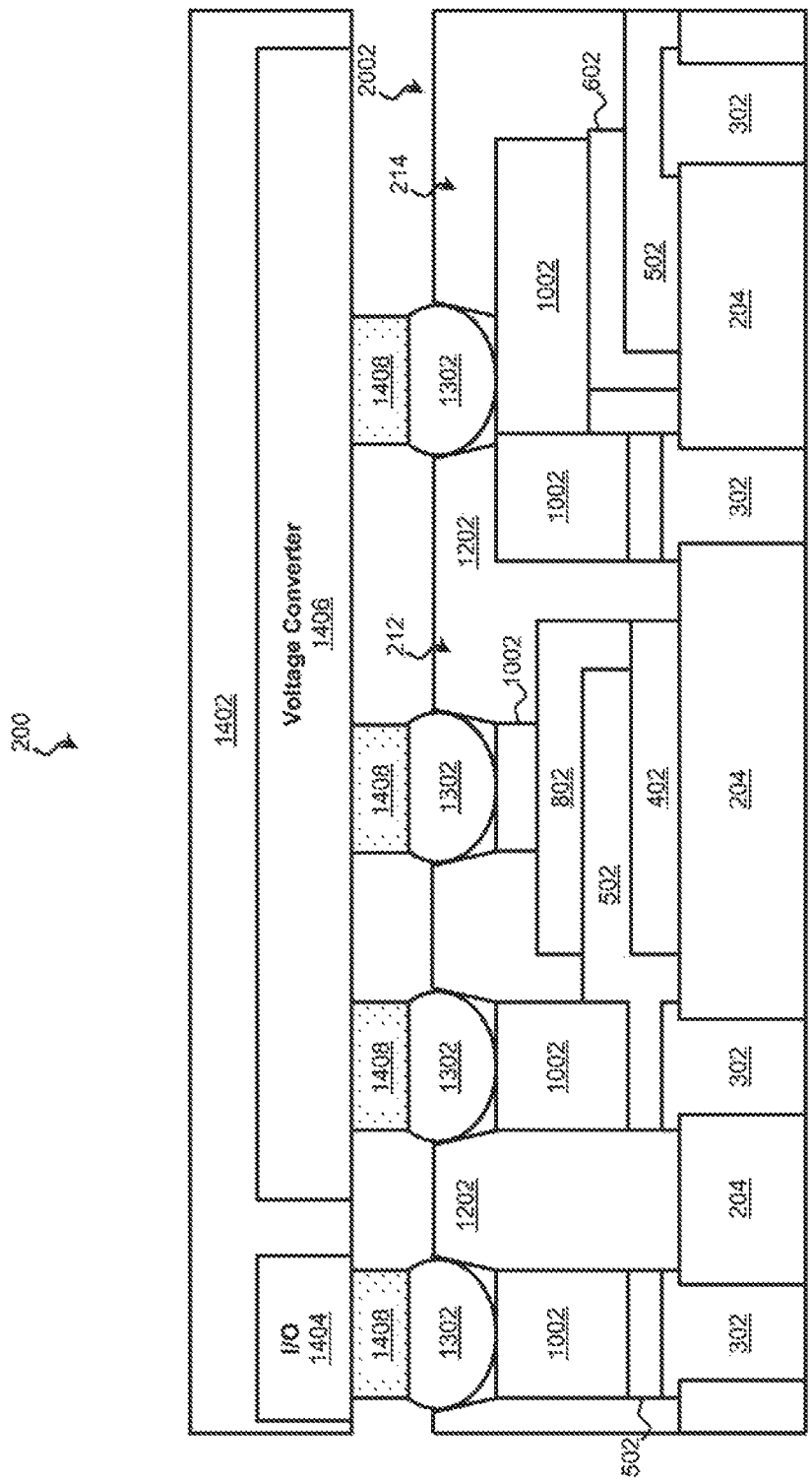

Referring to block 1710 of FIG. 17 and to FIG. 21, the circuit substrate 1402 is bonded to one of the dies 2002. This may be performed substantially as described in block 130 of FIG. 1B. However, whereas the process of block 130 may bond an entire wafer to another wafer, the process of block 1701 may bond a die 2002 to a die of the circuit substrate 1402. Any suitable bonding technique may be used including soldering and eutectic bonding. In some embodiments, an adhesive is used to secure the circuit substrate 1402 to the die 2002. The adhesive may include a thermal conductive material to facilitate the transfer of heat away from the circuit substrate 1402. Referring to block 1712 of FIG. 17, the workpiece 200 may be provided for further fabrication such as packaging.

It will be recognized that this technique provides efficient and reliable methods of forming passive circuit devices and incorporating them into an integrated circuit. The technique also provides mechanisms for tuning the performance of the passive devices being formed. Examples of inductors tuned for a range of applications are described with reference to FIGS. 23A-25B. In that regard, FIGS. 23A, 23B, 24A, 24B, 25A, and 25B are cross-sectional views of inductor 214 structures according to various aspects of the present disclosure. In these examples, the top magnetic material 802, the bottom magnetic material 402, the loop 504, the third conductive material 1002, and the inductor dielectric 702 are each substantially similar to those described with reference FIGS. 2-22. The embodiments of FIGS. 23A, 24A, and 25A may have a transverse cross-section substantially similar to that of FIG. 9B, while the embodiments of FIGS. 23B, 24B, and 25B may have a transverse cross-section substantially similar to that of FIG. 9A. Each example may be formed on the workpiece 200 using the method 100 of FIGS. 1A and 1B, the method 1700 of FIG. 17, or by any other suitable technique.

Figure 23A:
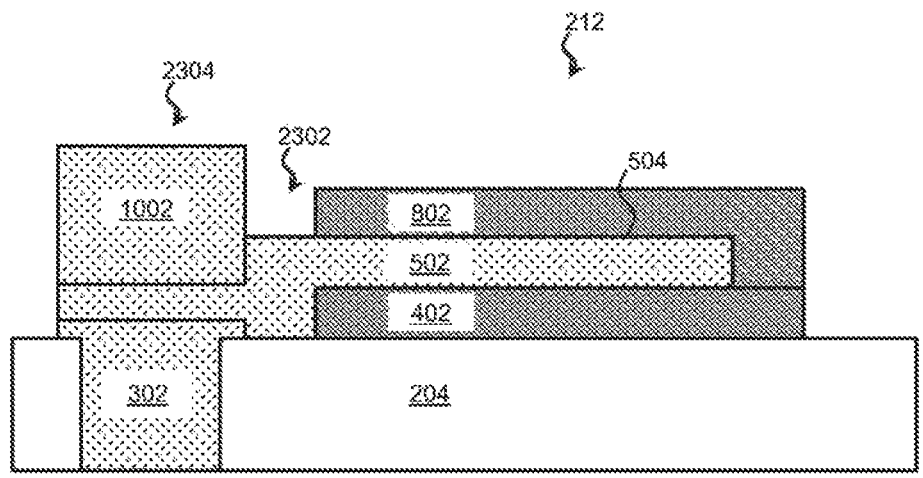
FIGS. 23A, 23B, 24A, 24B, 25A, and 25B are cross-sectional views of inductor structures according to various aspects of the present disclosure.

Referring first to FIG. 23A, in an exemplary embodiment, the inductor 212 includes a loop 504 of the third conductive material 1002 disposed on the bottom magnetic material 402. The top magnetic material 802 is disposed on the bottom magnetic material 402 and disposed surrounding the loop 504 so that it is on the top surfaces and the side surfaces (outside of the cross-sectional plane) of the loop 504. In particular, aside from a portion 2302 of the loop 504 near the inductor contacts 2304, the entire loop is encapsulated by the bottom magnetic material 402 and the top magnetic material 802.

Figure 23B:
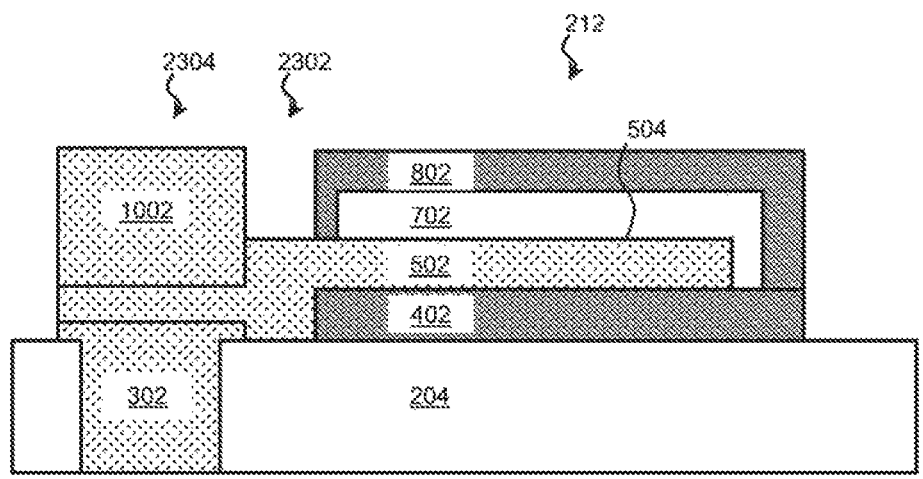

Referring to FIG. 23B, in another exemplary embodiment, the inductor 212 is substantially similar to that of FIG. 23A, and includes an inductor dielectric 702 disposed on the loop 504. In this example, the inductor dielectric surrounds the loop 504 and is on the top surfaces and the side surfaces (outside of the cross-sectional plane) of the loop 504. The top magnetic material 802 is disposed on the inductor dielectric 702. As can be seen, aside from a portion 2302 of the loop 504 near the inductor contacts 2304, the entire loop is encapsulated by the bottom magnetic material 402 and the top magnetic material 802.

Figure 24A:
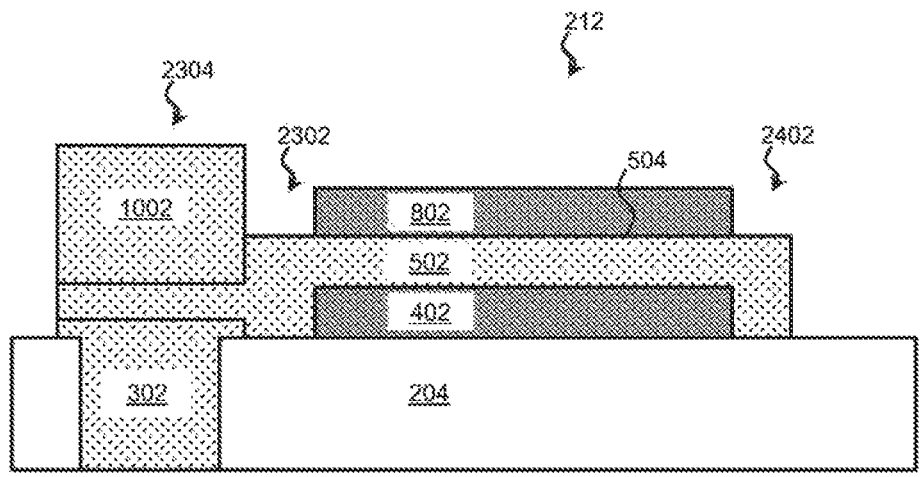

Referring to FIG. 24A, in an exemplary embodiment, the loop 504 is disposed on the bottom magnetic material 402, and a distal portion 2402 of the loop 504 opposite the inductor contacts 2304 extends beyond the bottom magnetic material. Similarly, while the top magnetic material 802 is disposed on the top surfaces and the side surfaces (outside of the cross-sectional plane) of the loop 504, the distal portion 2402 also extends beyond the top magnetic material. Thus, a middle portion of the loop is encapsulated by the bottom magnetic material 402 and the top magnetic material 802, but not necessarily the portion 2302 near the inductor contacts 2304 or the distal portion 2402.

Figure 24B:
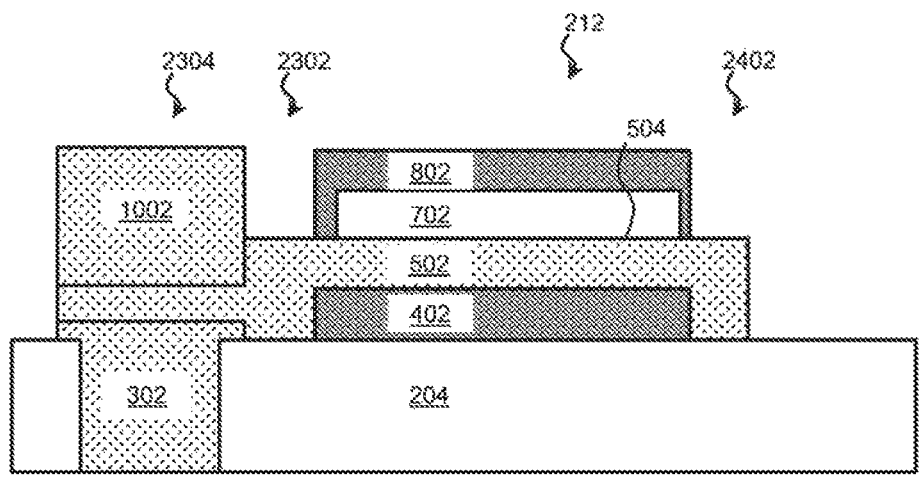

Referring to FIG. 24B, the inductor may include an inductor dielectric 702 disposed on the loop 504. The inductor dielectric may surround the loop 504 and be disposed on the top surfaces and the side surfaces (outside of the cross-sectional plane) of the loop 504. In turn, the top magnetic material 802 may be disposed on the inductor dielectric 702. In such embodiments, a middle portion of the loop is encapsulated by the bottom magnetic material 402 and the top magnetic material 802, but not necessarily the portion 2302 near the inductor contacts 2304 or the distal portion 2402.

Figure 25A:
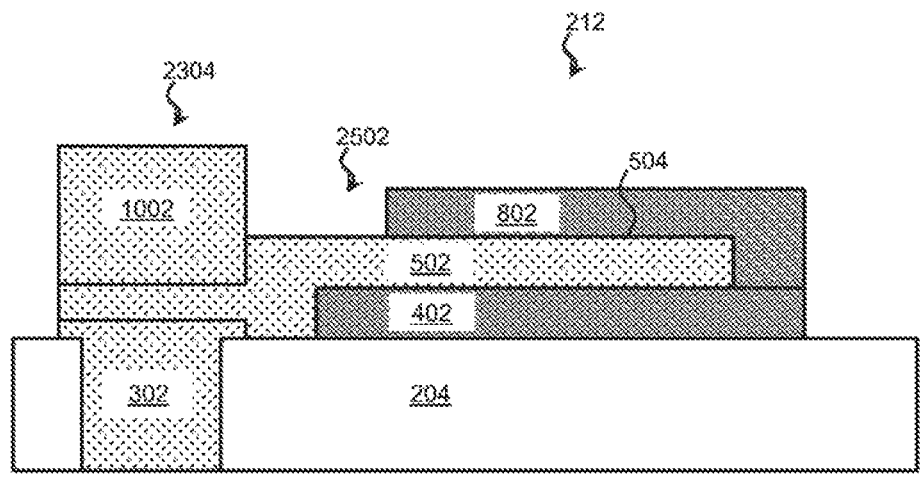

Referring to FIG. 25A, in a further exemplary embodiment, the loop 504 is disposed on the bottom magnetic material 402 and the top magnetic material 802 is disposed on the top surfaces and the side surfaces (outside of the cross-sectional plane) of the loop 504. In contrast to other examples, the top magnetic material 802 does not entirely cover the bottom magnetic material 402. Accordingly, the top magnetic material 802 only covers some of the loop 504, leaving a portion 2502 of the loop 504 near the inductor contacts 2304 that is disposed on the bottom magnetic material 402 uncovered by the top magnetic material 802.

Figure 25B:
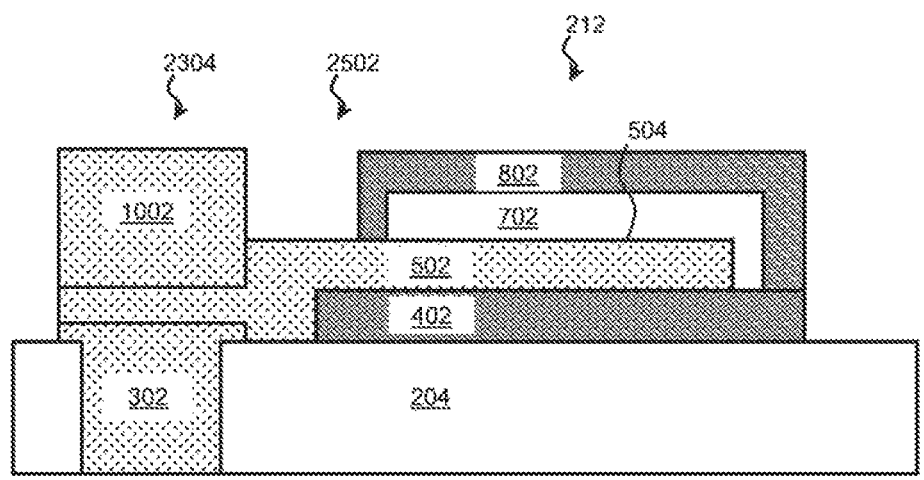

Referring to FIG. 25B, the inductor 212 may be substantially similar to that of FIG. 19B, yet may include an inductor dielectric 702 disposed on those portions of the loop 504 to be covered by the top magnetic material 802. Specifically, the inductor dielectric 702 may surround the loop 504 and be disposed on the top surfaces and the side surfaces (outside of the cross-sectional plane) of this portion of the loop 504. In turn, the top magnetic material 802 may be disposed on the inductor dielectric 702. In such embodiments, the top magnetic material 802 only covers some of the loop 504, leaving a portion 2502 of the loop 504 near the inductor contacts 2304 that is disposed on the bottom magnetic material 402 uncovered by the top magnetic material 802.

Thus, the present disclosure provides a variety of integrated circuit devices and a method for their formation and integration. In some embodiments, the provided method includes receiving a first substrate and applying a conductive material to the first substrate such that a loop of the conductive material is formed on the first substrate. A magnetic material is applied to the first substrate and surrounds at least a portion of the loop. A thermal process is performed on the first substrate having the conductive material and the magnetic material applied thereupon. The conductive material is bonded to a second substrate, and thereafter, the conductive material and the magnetic material are separated from the first substrate. In some such embodiments, the method further includes applying a dielectric on and within the loop such that the magnetic material further surrounds the dielectric. In some such embodiments, the loop includes a second portion disposed on the magnetic material that does not have any of the magnetic material disposed directly above.

In further embodiments, the provided method includes receiving a carrier substrate and forming at least one passive device structure on the carrier substrate. The carrier substrate is fired after the forming of the at least one passive device. The carrier substrate is bonded to a circuit substrate. Bonding includes electrically coupling the at least one passive device structure to a circuit element of the circuit substrate. After the bonding, the carrier substrate is separated from the at least one passive device structure. In some such embodiments, the carrier substrate is diced to form a plurality of dies prior to the bonding, and the bonding couples a die of the plurality of dies to the circuit substrate. In some such embodiments, the at least one passive device structure includes a capacitor and the forming of the at least one passive device structure includes depositing a first conductor on the carrier substrate to form a bottom plate of the capacitor; depositing a dielectric material on the bottom plate of the capacitor; and depositing a second conductor on the dielectric material to form a top plate of the capacitor.

In yet further embodiments, the circuit device includes a circuit element disposed on a substrate; a bonding structure disposed on the substrate and electrically coupled to the circuit element; and a co-fired ceramic passive device physically and electrically coupled to the bonding structure. In some such embodiments, the co-fired ceramic passive device includes an inductor, and the inductor includes a conductive loop extending through a ceramic magnetic material. In some such embodiments, the co-fired ceramic passive device includes a capacitor, and the capacitor includes a first conductive plate and a second conductive plate separated by a ceramic dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first passive device and a second passive device over a carrier substrate, wherein the first passive device is different than the second passive device, wherein the first passive device is laterally adjacent to the second passive device, and wherein the first passive device and the second passive device each include at least one material layer that includes a co-fired ceramic material;
   performing a co-firing process while at least a portion of the first passive device and at least a portion of the second passive device are exposed, wherein the co-firing process is performed to cause chemical changes in the co-fired ceramic material; and
   removing the carrier substrate after performing the co-firing process.

2. The method of claim 1, wherein:
   the forming the first passive device includes forming a conductive loop disposed between a first magnetic layer and a second magnetic layer, wherein the first magnetic layer, the second magnetic layer, or both includes a co-fired ceramic magnetic material; and
   the forming the second passive device includes forming a first conductive layer and a second conductive layer separated by a dielectric layer, wherein the first conductive layer, the second conductive layer, or both includes a co-fired ceramic conductive material.

3. The method of claim 2, wherein the conductive loop includes a co-fired conductive material and the dielectric layer includes a co-fired dielectric material.

4. The method of claim 2, wherein the dielectric layer is a first dielectric layer and the forming the first passive device further includes forming a second dielectric layer disposed between the conductive loop and the second magnetic layer.

5. The method of claim 2, further comprising forming the conductive loop and the first conductive layer at the same time.

6. The method of claim 2, further comprising:
   forming the first magnetic layer over the carrier substrate;
   thereafter, forming the conductive loop and the first conductive layer;
   thereafter, forming the dielectric layer;
   thereafter, forming the second magnetic layer; and
   thereafter, forming the second conductive layer.

7. The method of claim 2, further comprising:
   forming a dielectric layer over the carrier substrate before forming the first passive device and the second passive device; and
   forming a first conductive feature, a second conductive feature, and a third conductive feature extending through the dielectric layer, wherein the first conductive feature, the second conductive feature, and the third conductive feature include a co-fired ceramic conductive material, and further wherein:
     the conductive loop is formed on the first conductive feature,
     the first conductive layer is formed on the second conductive feature,
     the second conductive layer is formed on the third conductive feature, and
     the removing the carrier substrate includes separating the carrier substrate from the first conductive feature, the second conductive feature, and the third conductive feature.

8. The method of claim 2, further comprising forming a conductive feature over the second magnetic layer at the same time as forming the second conductive layer.

9. A method comprising:
   forming a capacitor and an inductor over a carrier substrate, wherein the capacitor is laterally adjacent to the inductor, and wherein the capacitor and the inductor each include at least one material layer that includes a co-fired ceramic material;
   performing a co-firing process on the capacitor and the inductor to cause chemical changes in the co-fired ceramic material, wherein the at least one material layer of the capacitor and the at least one material of the inductor are exposed during the performing of the co-firing process;
   encapsulating the capacitor and the inductor in an encapsulant after performing the co-firing process; and
   removing the carrier substrate after encapsulating the capacitor and the inductor in the encapsulant.

10. The method of claim 9, wherein the forming the capacitor and the inductor over the carrier substrate includes:

forming a first magnetic material over a first portion of the carrier substrate;
forming a first conductive material over the first magnetic material and a second portion of the carrier substrate;
forming a dielectric material over the first conductive material over the second portion of the carrier substrate;
forming a second magnetic material over the first conductive material over the first magnetic material;
forming a second conductive material over the dielectric material; and
wherein the first magnetic material, the first conductive material, the dielectric material, the second magnetic material, the second conductive material, or a combination thereof include a co-fired ceramic material.

11. The method of claim 10, wherein the dielectric material is a first dielectric material, and the forming the capacitor and the inductor further includes forming a second dielectric material over the first magnetic material before forming the second magnetic material, such that the second magnetic material is formed over the second dielectric material.

12. The method of claim 10, wherein the forming the capacitor and the inductor over the carrier substrate further includes:
    forming a patterned dielectric layer over the carrier substrate before forming the first magnetic material; and
    filling recesses extending through the patterned dielectric layer with a third conductive material, wherein the third conductive material includes a co-fired ceramic material.

13. The method of claim 12, wherein the forming the third conductive material includes screen printing, stencil printing, or inkjetting.

14. The method of claim 12, wherein the removing the carrier substrate includes separating the carrier substrate from the third conductive material.

15. The method of claim 9, wherein the capacitor, the inductor, and the carrier substrate form a portion of a workpiece, the co-fired ceramic material is a low temperature co-fired ceramic material, and the performing the co-firing process includes heating the workpiece to a temperature less than or equal to about 1,000° C.

16. The method of claim 9, the capacitor, the inductor, and the carrier substrate form a portion of a workpiece, the co-fired ceramic material is a high temperature co-fired ceramic material, and the performing the co-firing process includes heating the workpiece to a temperature greater than or equal to about 1,500° C.

17. The method of claim 9, further comprising bonding the capacitor and the inductor to a circuit substrate before removing the carrier substrate.

18. A method comprising:
    forming a first passive device and a second passive device over a carrier substrate, wherein the first passive device is different than the second passive device, wherein the first passive device is laterally spaced apart from the second passive device, wherein the first passive device and the second passive device each include at least one material layer that includes a co-fired ceramic material, and wherein the first passive device, the second passive device, and the carrier substrate are a portion of a workpiece;
    performing a co-firing process on the workpiece to cause chemical changes in the co-fired ceramic material, wherein the co-firing process comprises:
        heating the first passive device and the second passive device to a peak temperature to cause the chemical changes in the co-fired ceramic material, wherein the first passive device and the second passive device are exposed to an ambient air environment or an oxygen-free environment during the co-firing process; and
        cooling the workpiece;
    forming a dielectric material over the first passive device and the second passive device to encapsulate the first passive device and the second passive device after performing the co-firing process; and
    removing the carrier substrate after performing the co-firing process.

19. The method of claim 18, wherein the peak temperature is less than or equal to about 1,000° C., and wherein the heating the workpiece is performed in the ambient air environment.

20. The method of claim 18, wherein the peak temperature is greater than or equal to about 1,500° C., and wherein the heating the workpiece is performed in the oxygen-free environment.

* * * * *